(12) United States Patent
Eguchi et al.

(10) Patent No.: US 7,655,528 B2
(45) Date of Patent: Feb. 2, 2010

(54) MANUFACTURING METHOD OF SEMICONDUCTOR DEVICE

(75) Inventors: Satoshi Eguchi, Tokyo (JP); Akira Kanai, Tokyo (JP); Isao Miyashita, Tokyo (JP); Seigo Nagashima, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 170 days.

(21) Appl. No.: 10/588,959

(22) PCT Filed: Jan. 17, 2005

(86) PCT No.: PCT/JP2005/000473

§ 371 (c)(1),
(2), (4) Date: Aug. 10, 2006

(87) PCT Pub. No.: WO2005/076326

PCT Pub. Date: Aug. 18, 2005

(65) Prior Publication Data

US 2007/0275516 A1    Nov. 29, 2007

(30) Foreign Application Priority Data

Feb. 10, 2004    (JP) ............................. 2004-032886

(51) Int. Cl.
*H01L 21/331* (2006.01)

(52) U.S. Cl. .................. 438/312; 438/357; 257/E21.09

(58) Field of Classification Search ................. 438/312, 438/197, 507, 350, 357, 309; 257/E21.09, 257/85, 97, 592
See application file for complete search history.

(56) References Cited

U.S. PATENT DOCUMENTS

| 6,306,211 B1 * | 10/2001 | Takahashi et al. ............. 117/86 |
| 2002/0109135 A1 | 8/2002 | Murota et al. |
| 2003/0162370 A1 * | 8/2003 | Sukegawa et al. ........... 438/478 |

FOREIGN PATENT DOCUMENTS

| JP | 2000-012703 | 1/2000 |
| JP | 2000-340512 | 12/2000 |
| JP | 2002-237590 | 8/2002 |
| JP | 2003-203872 | 7/2003 |
| JP | 2003-257868 | 9/2003 |

* cited by examiner

*Primary Examiner*—Asok K Sarkar
*Assistant Examiner*—Julia Slutsker
(74) *Attorney, Agent, or Firm*—Antonelli, Terry, Stout & Kraus, LLP.

(57) ABSTRACT

$SiH_3CH_3$ having the concentration of 1 to 10% is diluted with $H_2$ and a portion of the diluted $SiH_3CH_3$, $GeH_4$ and $SiH_4$ (or DCS) are respectively supplied to a chamber of an epitaxial device at predetermined flow rates, and SiGe:C is formed by an epitaxial growth technique. By diluting the $SiH_3CH_3$, the concentration of oxygen-based impurity contained in the $SiH_3CH_3$ is reduced and hence, the oxygen-based impurity which is supplied to a chamber are reduced whereby the concentration of oxygen-based impurity contained in the SiGe:C formed in a film is reduced.

20 Claims, 23 Drawing Sheets

FIG. 11(a)
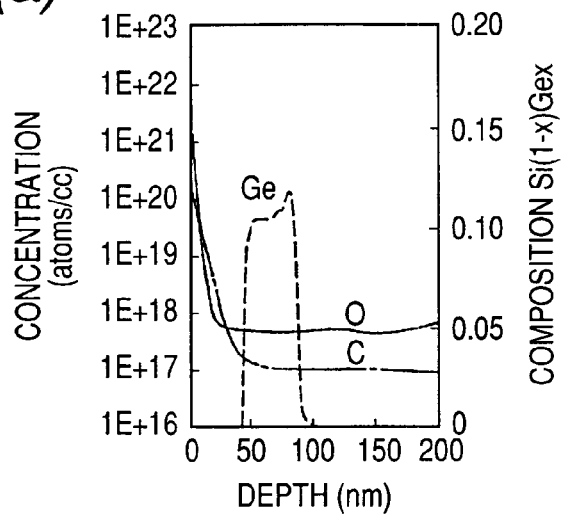
FIG. 11(b)
FIG. 12
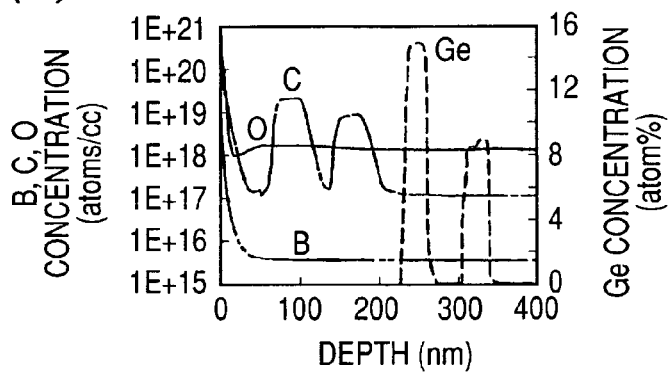
| SiH3CH3 CONCENTRATION (%) | OXYGEN-BASED IMPURITY CONCENTRATION (ppm) (THEORETICAL VALUE) | OXYGEN-BASED IMPURITY CONCENTRATION (ppm) (MAKER GUARANTEED VALUE) |
|---|---|---|
| 100 | 10 | 10 |
| 10 | 1 | 10 |
| 5 | 0.5 | 10 |
| 1 | 0.1 | 10 |
| 0.1 | 0.01 | 10 |

FIG. 13

| | Carbon DN | SCR (sccm) | DIL (sccm) | INJ (sccm) | Conc. (%) | IMPURITY CONCENTRATION (ppm) | | DILUTION EFFECT | COMPARISON OF OXYGEN CONCENTRATION WITH RESPECT TO Conc.0.1% PRODUCT |
|---|---|---|---|---|---|---|---|---|---|
| | | | | | | BEFORE DILUTION | AFTER DILUTION | | |
| (a) | 0.060 | 50 | 450 | 60 | 1 | 0.1 | 0.010 | 0.100 | 1.0 |
| | 0.060 | 10 | 490 | 300 | 1 | 0.1 | 0.002 | 0.020 | 0.2 |
| | 0.060 | 10 | 990 | 600 | 1 | 0.1 | 0.001 | 0.010 | 0.1 |
| (b) | 0.060 | 10 | 990 | 60 | 10 | 1 | 0.010 | 0.010 | 1.0 |
| | 0.060 | 10 | 4990 | 300 | 10 | 1 | 0.002 | 0.002 | 0.2 |
| | 0.060 | 10 | 9990 | 600 | 10 | 1 | 0.001 | 0.001 | 0.1 |
| (c) | 0.060 | 10 | 490 | 60 | 5 | 0.5 | 0.010 | 0.020 | 1.0 |
| | 0.060 | 10 | 2490 | 300 | 5 | 0.5 | 0.002 | 0.004 | 0.2 |
| | 0.060 | 10 | 4990 | 600 | 5 | 0.5 | 0.001 | 0.002 | 0.1 |
| (d) | 0.060 | 60 | — | — | 0.1 | 0.01 | — | — | — |

FIG. 14(a)

| Carbon DN | SCR (sccm) | DIL (sccm) | INJ (sccm) | Conc. (%) | IMPURITY CONCENTRATION (ppm) BEFORE DILUTION | IMPURITY CONCENTRATION (ppm) AFTER DILUTION | COMPARISON OF OXYGEN CONCENTRATION WITH RESPECT TO Conc.0.1% PRODUCT | COMPARISON OF SiH3CH3 CONSUMPTION QUANTITY (FLOW RATE RATIO) WITH RESPECT TO Conc.0.1% PRODUCT |
|---|---|---|---|---|---|---|---|---|
| 0.060 | 10 | 490 | 300 | 1 | 0.1 | 0.002 | 0.2 | 0.167 (1/6) |
| 0.060 | 10 | 4990 | 300 | 10 | 1 | 0.002 | 0.2 | 0.167 (1/6) |
| 0.060 | 10 | 2490 | 300 | 5 | 0.5 | 0.002 | 0.2 | 0.167 (1/6) |
| 0.060 | 60 | — | — | 0.1 | 0.01 | — | — | — |

FIG. 14(b)

| Carbon DN | SCR (sccm) | DIL (sccm) | INJ (sccm) | Conc. (%) | IMPURITY CONCENTRATION (ppm) BEFORE DILUTION | IMPURITY CONCENTRATION (ppm) AFTER DILUTION | COMPARISON OF OXYGEN CONCENTRATION WITH RESPECT TO Conc.0.1% PRODUCT | COMPARISON OF COST PERFORMANCE WITH RESPECT TO Conc.0.1% PRODUCT |
|---|---|---|---|---|---|---|---|---|
| 0.060 | 10 | 490 | 300 | 1 | 0.1 | 0.002 | 0.2 | 0.28 (APPROXIMATELY 30%) |
| 0.060 | 10 | 4990 | 300 | 10 | 1 | 0.002 | 0.2 | 0.39 (APPROXIMATELY 40%) |
| 0.060 | 10 | 2490 | 300 | 5 | 0.5 | 0.002 | 0.2 | 0.49 (APPROXIMATELY 50%) |
| 0.060 | 60 | — | — | 0.1 | 0.01 | — | — | — |

FIG. 14(c)

| gas | COST COMPARISON (COST RATIO) WITH RESPECT TO Conc.0.1% PRODUCT |
|---|---|
| Conc.1%SiH3CH3+H2 | 1.7 |
| Conc.5%SiH3CH3+H2 | 2.4 |
| Conc.10%SiH3CH3+H2 | 2.9 |

FIG. 17

|  | i-SiGe:C | p+-SiGe:C | p--SiGe:C | cap-Si |
|---|---|---|---|---|
| Duration(sec) | 120 | 30 | 60 | 90 |
| MFC1 | 20000 | 20000 | 20000 | 20000 |
| MFC2(DCS) | 100 | 100 | 100 | 100 |
| MFC3 | 50 | 50 | 50 | - |
| MFC4 | - | 480 | 150 | 150 |
| MFC5 | - | 1000 | 1000 | 1000 |
| MFC6 | - | 600 | 200 | 200 |
| MFC7 | - | - | - | - |
| MFC8 | - | - | - | - |
| MFC9 | - | - | - | - |
| MFC10 | 10 | 10 | 10 | - |
| MFC11 | 490 | 490 | 490 | - |
| MFC12 | 300 | 300 | 300 | - |
| MFC13 | 10 | 10 | 10 | 6 |

44 43 42 41

44 43 42 41

MANUFACTURING METHOD OF SEMICONDUCTOR DEVICE

TECHNICAL FIELD

The present invention relates to a manufacturing method of a semiconductor device, and more particularly to a technique which is effectively applicable to a manufacturing technique of a semiconductor device having SiGe:C which is formed using an epitaxial growth technique.

BACKGROUND OF THE INVENTION

Japanese Patent Laid-open 2003-203872 (patent document 1) discloses a vertical-type low-pressure CVD device which uses a mechanical booster pump and a dry pump, and maintains a wafer reaction atmosphere in highly clean state by introducing a raw material gas from an upper portion of a reaction chamber and by exhausting the raw material gas from a lower portion of the reaction chamber thus obtaining high-quality Si, SiGe or SiGeC.

Further, Japanese Patent Laid-open 2002-237590 (patent document 2) discloses a MOS-type field effect transistor in which a channel region has the stacked structure formed of a Si layer and a SiGe layer or a SiGeC layer sequentially from a surface, a source layer and a drain layer which are formed of SiGe or SiGeC containing high-concentration impurity atoms which impart a desired conductive type are brought into contact with both end surfaces of the channel region, and surfaces of the source layer and the drain layer which are formed of SiGe or SiGeC have a shape which is raised upwardly from a position of a bottom portion of a gate electrode.

Patent document 1: Japanese Patent Laid-open 2003-203872
Patent document 2: Japanese Patent Laid-open 2002-237590

DISCLOSURE OF THE INVENTION

Problems to be Solved by the Invention

Various studies have been made to enhance the performance of a bipolar transistor. For example, a HBT (Heterojunction Bipolar Transistor) technique has been studied to increase a current amplification factor. The HBT is a bipolar transistor having the hetero junction (junction of different kinds) structure which increases an emitter inhibition band width of an emitter-base junction larger than a width of the base, and the junction of semiconductors of different kinds such as SiGe, Si, for example, is used for joining of the base and the emitter. This HBT is capable of performing a single power source operation as a high-output device used in a high-output amplifier and also possesses advantageous properties such as an operation with high efficiency and hence, the HBT has been mainly developed and manufactured for mobile phones.

Recently, SiGe:C which is formed by adding C (carbon) to SiGe has been developed as a material of the base of the HBT. Since C is an element which has a smaller atomic radius compared to Si or Ge and hence, SiGe:C has a smaller lattice constant than SiGe and hence, a strain can be reduced. Further, due to the alleviation of the strain, the thermal stability is enhanced. Still further, a conductive type of the base of the HBT is a p-type and hence, a p-type impurity, for example, B (boron) is added to a base material. However, B exhibits a high diffusion coefficient and hence, B spreads by moving between Si lattices by heat treatment thus increasing the base resistance whereby the fluctuation of property of the HBT is induced. However, with the addition of C to SiGe, C enters between the lattices of SiGe thus preventing the diffusion of B.

Further, SiGe:C is used not only as the material of a channel of HBT but also as a material of a channel of a MIS•FET (Metal Insulator Semiconductor Field Effect Transistor) which represents a field effect transistor. When the Si/SiGe:C structure is formed as a channel on a Si substrate, a strain is applied to Si due to the difference between a lattice constant of Si and a lattice constant of SiGe:C. Accordingly, the energy band structure of Si may be changed thus enhancing electron mobility or the hole mobility in the channel.

However, with respect to SiGe:C which is formed by an epitaxial growth technique, there exist various technical tasks which are explained hereinafter.

SiGe:C is formed by the epitaxial growth technique using a CVD (Chemical Vapor Deposition) device. $SiH_2CH_2$, $SiH_3CH_3$, $GeH_4$, $SiH_4$ or the like may be used as a raw material gas and $H_2$ is used as a carrier gas. When a concentration profile of C, Ge and O (oxygen) of SiGe:C (Ge concentration: 10%) which is formed using an epitaxial growth is analyzed using a SIMS (Secondary Ion Mass Spectrometry), oxygen-based impurity at a level of $1\times10^{18}$ cm$^{-3}$ which is approximately ten times as large as the oxygen-based impurity of SiGe formed by the epitaxial growth is detected.

Further, it has been found that the concentration of the oxygen-based impurity which is taken into SiGe:C depends on the C concentration or the Ge concentration and the concentration of the oxygen-based impurity is increased corresponding to the increase of the C concentration or the Ge concentration. This may be attributed to a fact that Ge—O joining energy ($659.4\pm12.6$/kJmol$^{-1}$) is larger than Ge—Si joining energy ($301.0\pm21.0$/kJmol$^{-1}$), Ge—C joining energy ($460.0\pm21.0$/kJmol$^{-1}$) and Ge—Ge joining energy ($263.6\pm7.1$/kJmol$^{-1}$) and O is liable to be easily joined to Ge.

However, when the SiGe layer is grown by the epitaxial growth by allowing a gas which contains Si (for example, $SiH_4$, $SiH_2Cl_2$ or the like) to react with a gas which contains Ge (for example, $GeH_4$), the oxygen concentration is equal to or less than a detection limit. Further, when epitaxial growth films are respectively formed by allowing a raw material gas $SiH_3CH_3$ which adds C or a raw material gas $GeH_4$ which adds Ge with a gas which contains Si (for example, $SiH_4$, $SiH_2Cl_2$ or the like), the oxygen-based impurity concentration which is detected by the SIMS in these films is far lower than $1\times10^{18}$ cm$^{-3}$, that is, at a level of $1\times10^{17}$ cm$^{-3}$ or equal to or below a detection limit. From above, it is estimated that in forming SiGe:C by the epitaxial growth, the Ge atoms fetch the oxygen-based impurity contained in $SiH_3CH_3$ so that the oxygen-based impurity is mixed into SiGe:C.

When SiGe:C is used as a material of the base of HBT, due to the oxygen-based impurity which is fetched by SiGe:C, a lifetime of a carrier is lowered. Accordingly, a re-coupling current is increased in the base of HBT and hence, the base current is increased thus giving rise to a drawback that hFE (emitter ground current gain) is lowered. Further, in SiGe:C, due to defects such as OSF, a stacking defect or the like attributed to oxygen atom, a point defect, a line defect or a face defect is induced and a current flows along an interface of the defect. This current cannot be controlled with a bias and becomes a leaked current. Accordingly, the use of SiGe:C in the base of the HBT or in the channel of the MIS•FET deteriorates the reliability such as a breakdown strength of the HBT or the MIS•FET.

It is an object of the present invention to provide a technique which can reduce the concentration of the oxygen-based impurity which is contained in SiGe:C which is formed by an epitaxial growth.

The above-mentioned and other objects and novel features of the present invention will become apparent from the description of the specification and attached drawings.

Means for Solving the Problems

To briefly explain the summary of typical inventions among the inventions disclosed in this specification, they are as follows.

In a manufacturing method of a semiconductor device (or an integrated circuit device, a semiconductor integrated circuit device, an electronic device or like) according to the present invention, $SiH_3CH_3$ having the concentration of 1 to 10% is diluted with $H_2$ and the diluted $SiH_3CH_3$ is supplied to a chamber of an epitaxial device at a predetermined flow rate thus reducing the concentration of oxygen-based impurity introduced from $SiH_3CH_3$ in the inside of the chamber. Accordingly, the concentration of the oxygen-based impurity contained in SiGe:C which is formed by an epitaxial growth is reduced.

The semiconductor device according to the present invention uses SiGe:C as a material of a base of a HBT or a channel of a MIS•FET, wherein the SiGe:C is formed by diluting $SiH_3CH_3$ having the concentration of 1 to 10% with $H_2$ and by supplying the diluted $SiH_3CH_3$ to a chamber of an epitaxial device at a predetermined flow rate thus setting the concentration of oxygen-based impurity which is formed by an epitaxial growth to $1\times10^{19}$ cm$^{-3}$ or less.

The summary of other inventions which are disclosed in this specification are described by dividing into some paragraphs described hereinafter.

1. A manufacturing method of a semiconductor device including the steps of:

(a) diluting a first gas which contains C of high concentration with a second gas;

(b) supplying a portion of the diluted first gas into a reaction chamber while using a third gas as a carrier gas;

(c) supplying a fourth gas containing Si and a fifth gas containing Ge into a reaction chamber while using the third gas as a carrier gas; and (d) forming SiGe:C by an epitaxial growth in the reaction chamber.

2. In the manufacturing method of a semiconductor device described in the paragraph 1, the first gas is $SiH_3CH_3$, $SiH_2(CH_3)_2$, $SiH(CH_3)_3$ or $Si(CH_3)_4$.

3. In the manufacturing method of a semiconductor device described in the paragraph 1, the second gas is $H_2$.

4. In the manufacturing method of a semiconductor device described in the paragraph 1, the first gas is $SiH_3CH_3$, and the concentration of $SiH_3CH_3$ is 0.1 to 20%.

5. In the manufacturing method of a semiconductor device described in the paragraph 1, the first gas is $SiH_3CH_3$, and the concentration of $SiH_3CH_3$ is 0.2 to 10%.

6. In the manufacturing method of a semiconductor device described in the paragraph 1, the first gas is $SiH_3CH_3$, and the concentration of $SiH_3CH_3$ is 0.6 to 5%.

7. In the manufacturing method of a semiconductor device described in the paragraph 1, the degree of dilution of the first gas is 2 to 100.

8. In the manufacturing method of a semiconductor device described in the paragraph 1, the degree of dilution of the first gas is 3 to 40.

9. In the manufacturing method of a semiconductor device described in the paragraph 1, the degree of dilution of the first gas is 4 to 20.

10. In the manufacturing method of a semiconductor device described in the paragraph 1, the concentration of oxygen-based impurity contained in the SiGe:C is equal to or less than $5\times10^{19}$ cm$^{-3}$.

11. In the manufacturing method of a semiconductor device device described in the paragraph 1, the concentration of oxygen-based impurity contained in the SiGe:C is equal to or less than $1\times10^{19}$ cm$^{-3}$.

12. In the manufacturing method of a semiconductor device described in the paragraph 1, the concentration of oxygen-based impurity contained in the SiGe:C is equal to or less than $5\times10^{18}$ cm$^{-3}$.

13. A semiconductor device in which SiGe:C is formed by an epitaxial growth and the concentration of oxygen-based impurity in the SiGe:C is equal to or less than $1\times10^{19}$ cm$^{-3}$ when the concentration of C is $3\times10^{20}$ cm$^{-3}$.

14. In the semiconductor device described in the paragraph 13, the SiGe:C constitutes a portion of a base of a bipolar transistor.

15. In the semiconductor device described in the paragraph 14, the concentration of Ge contained in SiGe:C is set to a value which falls within a range from 10 to 40%.

16. In the semiconductor device described in the paragraph 13, the SiGe:C constitutes a channel of a MISFET.

17. In the semiconductor device described in the paragraph 16, the concentration of Ge contained in the SiGe:C is set to a value which falls within a range from 20 to 60%.

The summary of other inventions which are disclosed in this specification are described by dividing into some paragraphs described hereinafter.

1. A manufacturing method of a semiconductor device including the steps of:

(a) preparing a first raw material gas which contains a silane-based compound gas containing carbon atoms (a compound such as mono-silane, di-silane, tri-silane or the like which substitutes hydrogen with a single or a plurality of groups such as methyl groups or alkyl groups which mainly contain carbon and hydrogen as main constitutional elements) with the first concentration of 0.3% or more in a first hydrogen gas (here, the hydrogen gas meaning the hydrogen gas which excludes the silane-based compound gas which is an object to be diluted) (here, the preparation meaning, for example, a manipulation to allow the first raw material gas to flow toward a reaction chamber from a gas cylinder in which the first raw material gas is filled);

(b) producing a first diluted raw material gas containing the silane-based compound gas with the second concentration lower than the first concentration by diluting the first raw material gas with a second hydrogen gas (the hydrogen gas being supplied to the reaction chamber by way of a purifier and hence, the concentration of the oxygen-based impurity thereof is largely reduced);

(c) supplying at least a first portion of the first diluted raw material gas (the first portion may be the whole first diluted raw material gas when necessary) into the inside of a reaction chamber in which a wafer to be treated is accommodated; and (d) forming a SiGe:C epitaxial layer or a SiGe:C-based epitaxial layer on a first main surface of the wafer to be treated using the first portion of the supplied first diluted raw material gas.

2. In the manufacturing method of a semiconductor device described in the paragraph 1, a remaining second portion of the first diluted raw material gas is not supplied to the inside of the reaction chamber (that is, the remaining second portion of the first diluted raw material gas is not introduced into a reaction path and is discharged to the outside via a vent or is made to return to a proper tank thus reducing the oxygen-based impurity contained in the raw material gas).

3. In the manufacturing method of a semiconductor device described in the paragraph 2 or 1, the first hydrogen gas and the second hydrogen gas have the substantially same concentration composition.

4. In the manufacturing method of a semiconductor device described in any one of the paragraphs 1 to 3, the purity of the second hydrogen gas is 99.99% or more.

5. In the manufacturing method of a semiconductor device described in any one of the paragraphs 1 to 4, the reaction chamber is an epitaxial layer forming reaction chamber of a single wafer epitaxial device (generally indicating an epitaxial device which treats one or two sheets of wafers at a time in the inside of the same reaction chamber, wherein the epitaxial device for processing one sheet being is specifically referred to as a one-sheet wafer epitaxial device for differentiating the device from a two-sheet wafer epitaxial device).

6. In the manufacturing method of a semiconductor device described in any one of the paragraphs 1 to 5, the reaction chamber is an epitaxial layer forming reaction chamber of a batch-type epitaxial device (generally indicating an epitaxial device which treats three or more sheets of wafers at a time in the inside of the same reaction chamber).

7. In the manufacturing method of a semiconductor device described in any one of the paragraphs 1 to 6, the epitaxial layer constitutes a portion of a base region of a HBT.

8. In the manufacturing method of a semiconductor device described in any one of the paragraphs 1 to 7, the epitaxial layer is a channel region of a strain SiGe-based MISFET.

9. In the manufacturing method of a semiconductor device described in any one of the paragraphs 1 to 8, the degree of dilution of the first diluted raw material gas (that is, (flow rate of first diluted raw material gas+flow rate of second hydrogen gas)/flow rate of first diluted raw material gas) is set to a value which falls within a range from 2 to 100.

10. In the manufacturing method of a semiconductor device described in any one of the paragraphs 1 to 9, the degree of dilution of the first diluted raw material gas is set to a value which falls within a range from 3 to 50.

11. In the manufacturing method of a semiconductor device described in any one of the paragraphs 1 to 10, the degree of dilution of the first diluted raw material gas is set to a value which falls within a range from 4 to 20.

12. In the manufacturing method of a semiconductor device described in any one of the paragraphs 1 to 11, the degree of dilution of the first diluted raw material gas is set to a value which falls within a range from 6 to 15.

13. In the manufacturing method of a semiconductor device described in any one of the paragraphs 1 to 12, the degree of introduction of the first diluted raw material gas (that is, (flow rate of first portion in first diluted raw material gas+flow rate of second portion in first diluted raw material gas)/flow rate of first portion in first diluted raw material gas, that is, inverse number of numerical value which indicates a rate of first diluted raw material gas which is introduced into the reaction chamber) is set to a value which falls within a range from 2 to 100.

14. In the manufacturing method of a semiconductor device described in any one of the paragraphs 1 to 13, the degree of introduction of the first diluted raw material gas is set to a value which falls within a range from 3 to 50.

15. In the manufacturing method of a semiconductor device described in any one of the paragraphs 1 to 14, the degree of introduction of the first diluted raw material gas is set to a value which falls within a range from 4 to 20.

16. In the manufacturing method of a semiconductor device described in any one of the paragraphs 1 to 15, the degree of introduction of the first diluted raw material gas is set to a value which falls within a range from 6 to 15.

17. In the manufacturing method of a semiconductor device described in any one of the paragraphs 1 to 16, the first concentration is equal to or more than 0.6%.

18. In the manufacturing method of a semiconductor device described in any one of the paragraphs 1 to 17, the first concentration is equal to or more than 1%.

19. In the manufacturing method of a semiconductor device described in any one of the paragraphs 1 to 18, the first concentration is equal to or more than 2%.

20. In the manufacturing method of a semiconductor device described in any one of the paragraphs 1 to 19, the first concentration is equal to or more than 5%.

21. A manufacturing method of a semiconductor device including the steps of:

(a) preparing a first raw material gas which contains a silane-based compound gas containing carbon atoms in a first hydrogen gas with a first concentration;

(b) supplying the first raw material gas to the inside of a reaction chamber in which a wafer to be treated is accommodated; and (c) forming a SiGe:C epitaxial layer or a SiGe:C-based epitaxial layer on a first main surface of the wafer to be treated using the supplied first raw material gas, wherein the first concentration is 0.6% or more (that is, the first raw material gas with the high concentration.

22. In the manufacturing method of a semiconductor device described in the paragraph 21, the first concentration is equal to or more than 1%.

23. In the manufacturing method of a semiconductor device described in either of the paragraphs 21 to 22, the first concentration is equal to or more than 2%.

24. In the manufacturing method of a semiconductor device described in any one of the paragraphs 21 to 23, the first concentration is equal to or more than 5%.

25. In the manufacturing method of a semiconductor device described in any one of the paragraphs 21 to 24, the purity of the first hydrogen gas is 99.99% or more.

26. In the manufacturing method of a semiconductor device described in any one of the paragraphs 21 to 25, the reaction chamber is an epitaxial layer forming reaction chamber of a single wafer epitaxial device.

27. In the manufacturing method of a semiconductor device described in any one of the paragraphs 21 to 26, the reaction chamber is an epitaxial layer forming reaction chamber of a batch-type epitaxial device.

28. In the manufacturing method of a semiconductor device described in any one of the paragraphs 21 to 27, the epitaxial layer constitutes a portion of a base region of a HBT.

29. In the manufacturing method of a semiconductor device described in any one of the paragraphs 21 to 28, the epitaxial layer is a channel region of a strain SiGe-based MISFET.

30. A manufacturing method of a semiconductor device including the steps of:

(a) preparing a first raw material gas which contains a silane-based compound gas containing carbon atoms in a first hydrogen gas with a first concentration;

(b) supplying the first raw material gas to the inside of a reaction chamber in which a wafer to be treated is accommodated; and (c) forming a SiGe:C epitaxial layer or a SiGe:C-based epitaxial layer on a first main surface of the wafer to be treated using the supplied first raw material gas, wherein the concentration of an oxygen-based impurity (impurity containing oxygen atoms, for example, an oxygen gas, a carbon dioxide gas, moisture such as vapor or the like) of the first raw material gas is less than 5 ppm.

31. In the manufacturing method of a semiconductor device described in the paragraph 30, the concentration of the oxygen-based impurity of the first raw material gas is less than 3 ppm.

32. In the manufacturing method of a semiconductor device described in the paragraph 30, the concentration of the oxygen-based impurity of the first raw material gas is less than 1 ppm.

33. In the manufacturing method of a semiconductor device described in the paragraph 30, the concentration of the oxygen-based impurity of the first raw material gas is less than 0.5 ppm.

34. In the manufacturing method of a semiconductor device described in the paragraph 30, the concentration of the oxygen-based impurity of the first raw material gas is less than 0.2 ppm.

35. In the manufacturing method of a semiconductor device described in the paragraph 30, the concentration of the oxygen-based impurity of the first raw material gas is less than 0.1 ppm.

36. In the manufacturing method of a semiconductor device described in any one of the paragraphs 30 to 35, the manufacturing method further includes a following step of:
(d) diluting the first raw material gas with a second hydrogen gas after the step (a) and before the step (b).

37. In the manufacturing method of a semiconductor device described in any one of the paragraphs 30 to 36, in the step (b), a first portion of the first raw material gas is supplied to the inside of the reaction chamber.

38. A manufacturing method of a semiconductor device including the steps of:
(a) preparing a first raw material gas which contains a silane-based compound gas containing carbon atoms in a first hydrogen gas with a first concentration;
(b) supplying the first raw material gas to the inside of a reaction chamber in which a wafer to be treated is accommodated; and
(c) forming a SiGe:C epitaxial layer or a SiGe:C-based epitaxial layer on a first main surface of the wafer to be treated using the supplied first raw material gas, wherein in the step (b), the first raw material gas is supplied to the reaction chamber through a purifier or a filter having an ability to remove an oxygen-based impurity gas.

39. In the manufacturing method of a semiconductor device described in the paragraph 38, the concentration of the oxygen-based impurity of the first raw material gas after passing the purifier or the filter is less than 5 ppm.

40. In the manufacturing method of a semiconductor device described in the paragraph 38, the concentration of the oxygen-based impurity of the first raw material gas after passing the purifier or the filter is less than 3 ppm.

41. In the manufacturing method of a semiconductor device described in the paragraph 38, the concentration of the oxygen-based impurity of the first raw material gas after passing the purifier or the filter is less than 1 ppm.

42. In the manufacturing method of a semiconductor device described in the paragraph 38, the concentration of the oxygen-based impurity of the first raw material gas after passing the purifier or the filter is less than 0.5 ppm.

43. In the manufacturing method of a semiconductor device described in the paragraph 38, the concentration of the oxygen-based impurity of the first raw material gas after passing the purifier or the filter is less than 0.2 ppm.

44. In the manufacturing method of a semiconductor device described in the paragraph 38, the concentration of the oxygen-based impurity of the first raw material gas after passing the purifier or the filter is less than 0.1 ppm.

45. In the manufacturing method of a semiconductor device described in any one of the paragraphs 38 to 35, the first raw material gas has the high concentration.

46. In the manufacturing method of a semiconductor device described in any one of the paragraphs 38 to 45, the manufacturing method further includes a following step of:
(d) diluting the first raw material gas with a second hydrogen gas after the step (a) and before the step (b).

47. In the manufacturing method of a semiconductor device described in any one of the paragraphs 38 to 46, in the step (b), a first portion of the first raw material gas is supplied to the inside of the reaction chamber.

48. A semiconductor device including the following constitution:
(a) A base body having a first main surface; and (b) A SiGe:C based epitaxial layer which is formed on the first main surface, wherein the carbon concentration of the epitaxial layer is equal to or less than $3\times10^{20}$ cm$^{-3}$ and the oxygen-based impurity concentration is equal to or less than $1\times10^{19}$ cm$^{-3}$.

49. In the semiconductor device described in the paragraph 48, the epitaxial layer constitutes a portion of a base of a bipolar transistor.

50. In the semiconductor device described in the paragraph 49, the concentration of Ge which the epitaxial layer contains is set to a value which falls within a range from 10 to 40%.

51. In the semiconductor device described in the paragraph 48, the epitaxial layer constitutes a channel of a MISFET.

52. In the semiconductor device described in the paragraph 51, the concentration of Ge which the epitaxial layer contains is set to a value which falls within a range from 20 to 60%.

53. A manufacturing method of a semiconductor device including the steps of:
(a) preparing a first raw material gas which contains a silane-based compound gas containing carbon atoms in a first hydrogen gas (that is, a gas containing hydrogen as a main component) with a first concentration;
(b) producing a first diluted raw material gas containing the silane-based compound gas with a second concentration lower than the first concentration by diluting the first raw material gas with a second hydrogen gas (that is, a gas which contains hydrogen as a main component);
(c) supplying the first diluted raw material gas into the inside of a reaction chamber in which a wafer to be treated is accommodated; and
(d) forming a SiGe:C epitaxial layer or the SiGe:C-based epitaxial layer on a first main surface of the wafer to be treated using the supplied first diluted raw material gas, wherein the first concentration is equal to or more than 0.6% (may be at least 0.3% or more).

54. In the manufacturing method of a semiconductor device described in the paragraph 53, the first concentration is equal to or more than 1%.

55. In the manufacturing method of a semiconductor device described in either one of the paragraph 53 or 54, the first concentration is equal to or more than 2%.

56. In the manufacturing method of a semiconductor device described in any one of the paragraphs 53 to 55, the first concentration is equal to or more than 5%.

57. In the manufacturing method of a semiconductor device described in any one of the paragraphs 53 to 56, the purity of the first hydrogen gas is equal to or more than 99.99%.

58. In the manufacturing method of a semiconductor device described in any one of the paragraphs 53 to 57, the reaction chamber is an epitaxial layer forming reaction chamber of a single wafer epitaxial device.

59. In the manufacturing method of a semiconductor device described in any one of the paragraphs 53 to 58, the reaction chamber is an epitaxial layer forming reaction chamber of a batch-type epitaxial device.

60. In the manufacturing method of a semiconductor device described in any one of the paragraphs 53 to 59, the epitaxial layer constitutes a portion of a base region of a HBT.

61. In the manufacturing method of a semiconductor device described in any one of the paragraphs 53 to 60, the epitaxial layer is a channel region of a strain SiGe-based MISFET.

Advantageous Effects of the Present Invention

To briefly explain advantageous effects obtained by typical inventions among the inventions disclosed in this application, they are as follows.

Since the concentration of the oxygen-based impurity contained in SiGe:C which is formed by the epitaxial growth can be reduced, even when SiGe:C is used as the material of the base of the HBT, it is possible to prevent the lowering of a lifetime of a carrier attributed to the oxygen-based impurity. As a result, it is possible to enhance the hFE. Further, even when SiGe:C is used as the material of the base of the HBT or the channel of the MIS•FET, a crystal defect attributed to oxygen atoms can be reduced and hence, a leaked current can be reduced thus enhancing the breakdown strength.

BRIEF DESCRIPTION OF THE DRAWINGS

FIG. 11(a) is a SIMS profile of impurities of SiGe formed by an epitaxial growth, and FIG. 11(b) is a SIMS profile when Ge is doped with $GeH_4$ and C is doped with $SiH_3CH_3$ in a respective box shape during an epitaxial growth of Si using $SiH_4$.

FIG. 12 is a view showing an $SiH_3CH_3$ concentration and the theoretical concentration of oxygen-based impurity contained in $SiH_3CH_3$ diluted with $H_2$.

FIG. 13(a) is a view showing a dilution effect of $SiH_3CH_3$ having the concentration of 1%, FIG. 13(b) is a view showing a dilution effect of $SiH_3CH_3$ having the concentration of 5%, FIG. 13(c) is a view showing a dilution effect of $SiH_3CH_3$ having the concentration of 10%, and FIG. 13(d) is a view showing a concentration of undiluted $SiH_3CH_3$.

FIG. 14(a) is a view showing a ratio between a consumed quantity of diluted $SiH_3CH_3$ having the concentration of 1%, 5% or 10% and a consumed quantity of undiluted $SiH_3CH_3$ having the concentration of 0.1%, FIG. 14(b) is a view showing a ratio between a cost performance of diluted $SiH_3CH_3$ having the concentration of 1%, 5% or 10% and a cost performance of undiluted $SiH_3CH_3$ having the concentration of 0.1%, and FIG. 14(c) is a view showing a cost ratio between undiluted $SiH_3CH_3$ having the concentration of 0.1% and diluted $SiH_3CH_3$ having the concentration of 1%, 5% or 10%.

FIG. 16 is a graph showing the relationship between the concentrations of oxygen-based impurity and C contained in SiGe:C which is formed by using undiluted $SiH_3CH_3$ and SiGe:C which is formed by using diluted $SiH_3CH_3$ having the concentration of 1%, 5% or 10% and.

FIG. 17 is a view showing an example of a gas flow rate adjusted by respective mass flow controllers in the epitaxial growth of the embodiment 1 of the present invention.

BEST MODE FOR CARRYING OUT THE INVENTION

Figure 1:
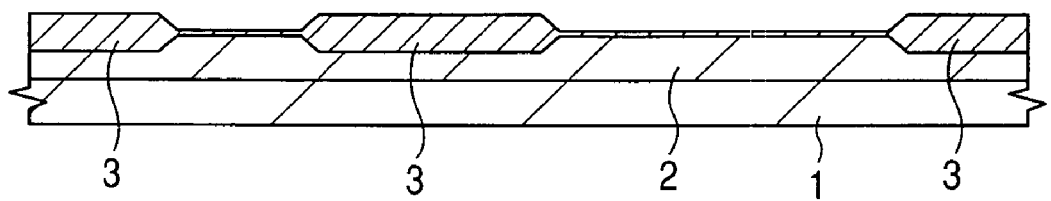
FIG. 1 is a cross-sectional view of an essential part of a substrate showing a manufacturing step of a HBT which uses a selective SiGe:C as a material of a base according to an embodiment 1 of the present invention.

In the embodiments described hereinafter, when it is necessary for the convenience sake, the invention is explained by dividing the invention into a plurality of sections or embodiments. However, unless otherwise explicitly described, these sections or embodiments are not irrelevant to each other, wherein there exists a relationship that one section or embodiment is a modification, a detail, a complementary explanation of a portion or the whole of other section or embodiment.

Further, in the embodiments described hereinafter, when the number of elements and the like (including pieces, numerical values, quantity, range and the like) are referred to, unless otherwise particularly specified or the number is apparently limited to a specified number in principle, the number is not limited to the specified number and may be set to a value which is larger or lower than the specified number.

Further, in the embodiment described hereinafter, it is needless to say that the constitutional features (including element steps and the like) are not always indispensable unless otherwise specified or unless they are considered indefinitely indispensable in principle.

In the same manner, in the embodiments described hereinafter, when the reference is made with respect to the shape, the positional relationship and the like of the constitutional features, unless otherwise specified or unless it is indefinitely considered unreasonable in view of the principle, these shapes and positional relationship substantially include those which approximate or are similar to these shapes. The same goes for the above-mentioned numerical values and ranges.

Further, in all drawings for explaining this embodiments, parts having identical functions are given same symbols and their repeated explanation is omitted.

Further, the wafer means a silicon single-crystal substrate (having a substantially planner circular shape in general), a sapphire substrate, a glass substrate, other insulating, non-insulating or semiconductor substrates, and a composite substrate thereof used for manufacturing integrated circuits. Further, in this specification, in the present invention, the "semiconductor device" includes not only a semiconductor device which is formed on the semiconductor or insulating substrate such as the silicon wafer or the sapphire substrate but also a semiconductor device which is formed on other insulating substrate made of glass or the like such as TFT (Thin-Film-Transistor) and STN (Super-Twisted-Nematic) liquid crystal or the like unless otherwise specified.

Here, in the embodiments described hereinafter, to make the embodiments conform to a specific device and other conditions and requirements (to ensure controllability in view of a width of an adjustment of a doping quantity, for example), besides the silane-based raw material gas which contains carbon, the introduction of various gases into the reaction chamber due to the discharge of some gases by dilution and venting is stabilized, is performed with high accuracy and improved controllability. However, the method for introducing the respective gases is not limited to these methods, and various gases may be introduced by a simple direct introduction method, or by simple dilution, or by a method which uses only partial venting. The same goes for the supply of the silane-based raw material gas which contains carbon.

Here, when the gases referred in this specification, for the sake of brevity, the gases referred using the name of a main component which constitutes the gas or particularly focused element, atom or molecule. However, it is needless to say that unless otherwise specified or when such a naming is not proper in view of principles, the gas is allowed to contain other gases (added gas, diluted gas or the like).

Hereinafter, embodiments according to the present invention are explained in detail in conjunction with drawings.

Embodiment 1

Figure 2:
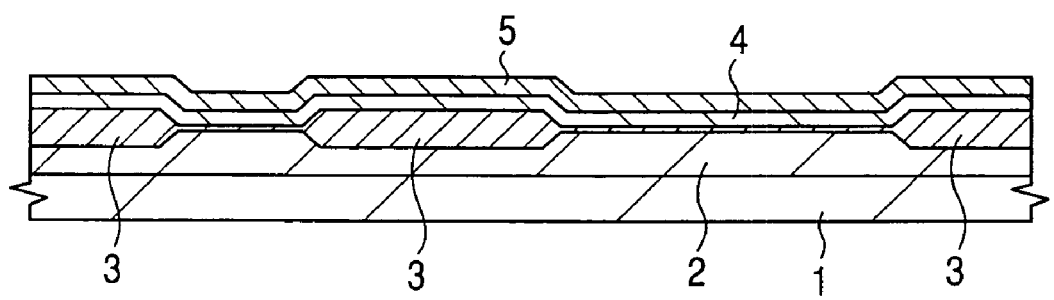
FIG. 2 is a cross-sectional view of an essential part of the same place in FIG. 1 showing a manufacturing step of the HBT which follows the manufacturing step shown in FIG. 1.

A manufacturing method of a HBT using selective SiGe:C as a base according to this embodiment is explained in order of steps in conjunction with FIG. 1 and FIG. 2.

First of all, as shown in FIG. 1, a substrate 1 is prepared. A substrate 1 at this stage is formed of a member having a planer approximately circular shape which produces a semiconductor wafer and is formed of an $n^+$ type silicon single crystalline which is formed by a crystal pulling method such as Czochralski method, for example. The resistivity of the substrate 1 is, for example, 3 to 6 mΩcm. Next, an n type impurity is injected by ion implantation into the substrate 1 thus forming n well (collector) 2. Subsequently, a silicon oxide film is formed on a surface of the substrate 1 by a thermal oxidation method and, thereafter, a silicon nitride film is stacked on the substrate 1 by a CVD method. Subsequently, the silicon nitride film is etched using a patterned resist as a mask and the resist is removed and, thereafter, by a selective thermal oxidation method, an LOCOS oxide film 3 having a thickness of approximately 200 to 400 nm is formed in an element isolation region of the substrate 1. An active region of the substrate 1 is defined by the LOCOS oxide film 3. Thereafter, the above-mentioned silicon nitride film is removed. Here, the element isolation is not limited to the LOCOS oxide film 3, and a groove-type element isolation in which an insulation film is embedded in a groove may be used, for example.

Next, as shown in FIG. 2, on the substrate 1, an insulation film 4 having a thickness of approximately 50 to 200 and a silicon poly-crystalline film 5 having a thickness of approximately 50 to 400 nm are sequentially stacked. As the insulation film 4, for example, a silicon oxide film which is formed by stacking by a plasma CVD method which uses TEOS (Tetra Ethyl Ortho silicate: $Si(OC_2H_5)_4$) and ozone ($O_3$) as source gasses or a CVD method which thermally decomposes organic silane can be exemplified. The silicon oxide film has a density which is smaller than a density of a silicon oxide film which is formed into a silicon single crystal by thermal oxidation and has a wet etching speed which is approximately 10 times as fast as a wet etching speed of a silicon oxide film formed by thermal oxidation. Subsequently, a p-type impurity, for example, B is injected by ion implantation into the silicon poly-crystalline film 5 thus forming conductive type of the silicon poly-crystalline film 5 into $p^+$ type.

Figure 3:
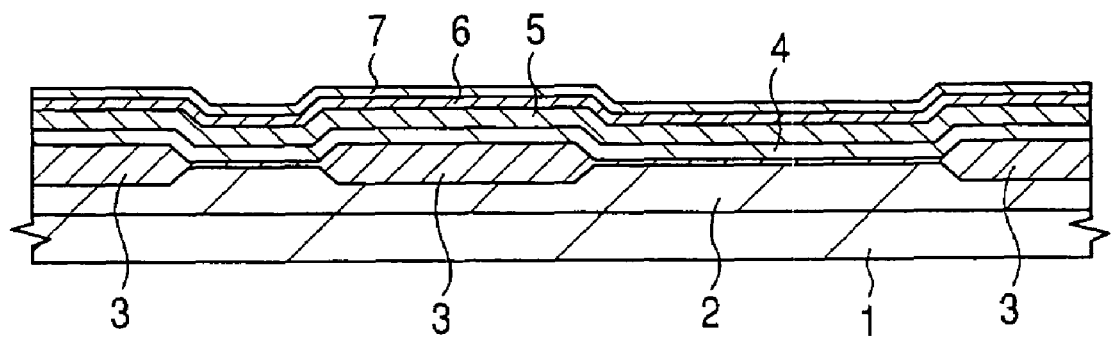
FIG. 3 is a cross-sectional view of an essential part of the same place in FIG. 1 showing a manufacturing step of the HBT which follows the manufacturing step shown in FIG. 2.

Next, as shown in FIG. 3, on the substrate 1, a silicon nitride film 6 having a thickness of approximately 50 to 200 nm and an insulation film 7 having a thickness of approximately 50 to 200 nm are sequentially stacked.

Figure 4:
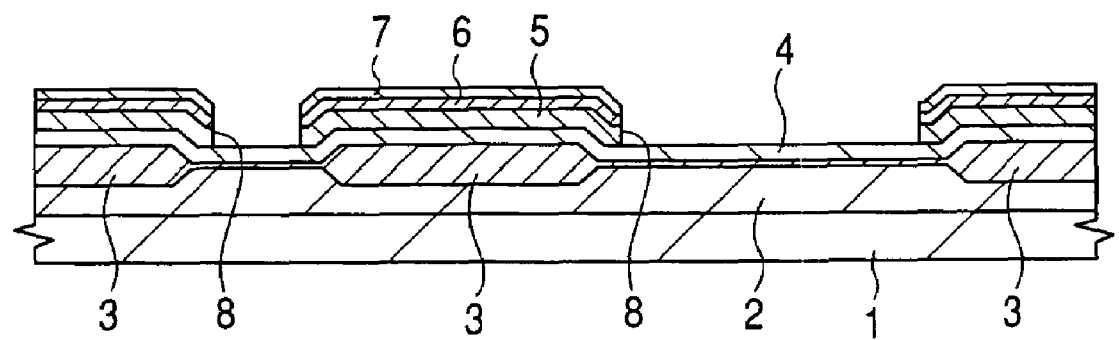
FIG. 4 is a cross-sectional view of an essential part of the same place in FIG. 1 showing a manufacturing step of the HBT which follows the manufacturing step shown in FIG. 3.

Next, as shown in FIG. 4, the insulation film 7, the silicon nitride film 6 and the silicon poly-crystalline film 5 are sequentially etched using a patterned resist as a mask and the insulation film 4 is exposed in the region where the HBT is formed thus forming an emitter opening portion 8. A base-pull-out electrode is formed on the formed silicon poly-crystalline film 5.

Figure 5:
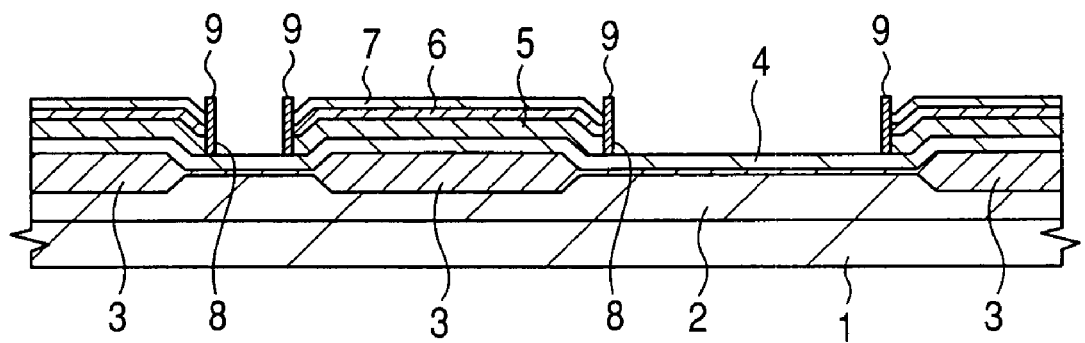
FIG. 5 is a cross-sectional view of an essential part of the same place in FIG. 1 showing a manufacturing step of the HBT which follows the manufacturing step shown in FIG. 4.

Next, as shown in FIG. 5, on the substrate 1, a silicon nitride film having a thickness of approximately 10 to 100 nm is stacked and the silicon nitride film is etched by anisotropic etching using a RIE method, for example, and spacers 9 are formed on a side wall of the emitter opening portion 8.

Figure 6:
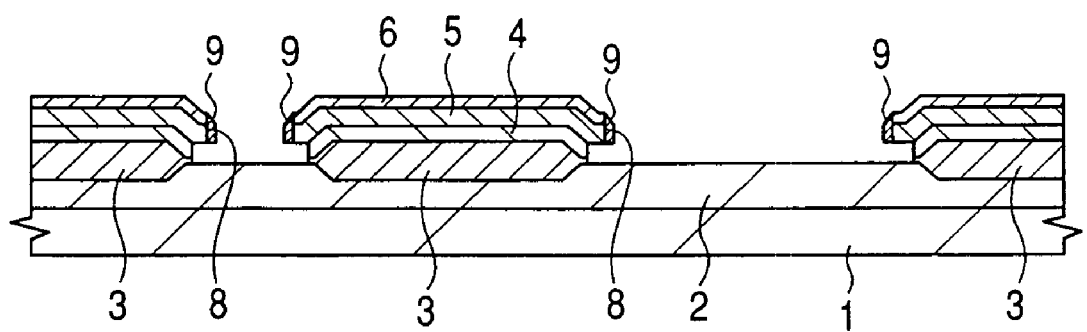
FIG. 6 is a cross-sectional view of an essential part of the same place in FIG. 1 showing a manufacturing step of the HBT which follows the manufacturing step shown in FIG. 5.

Next, as shown in FIG. 6, the insulation film 7 is removed by a wet etching and a portion of the insulation film 4 which is exposed is removed thus exposing a surface of the active region of the substrate 1 (n well 2). Here, a portion of the insulation film 4 below the silicon poly-crystalline film 5 is also subjected to the wet etching thus generating a gap having a size of approximately 10 nm.

Figure 7:
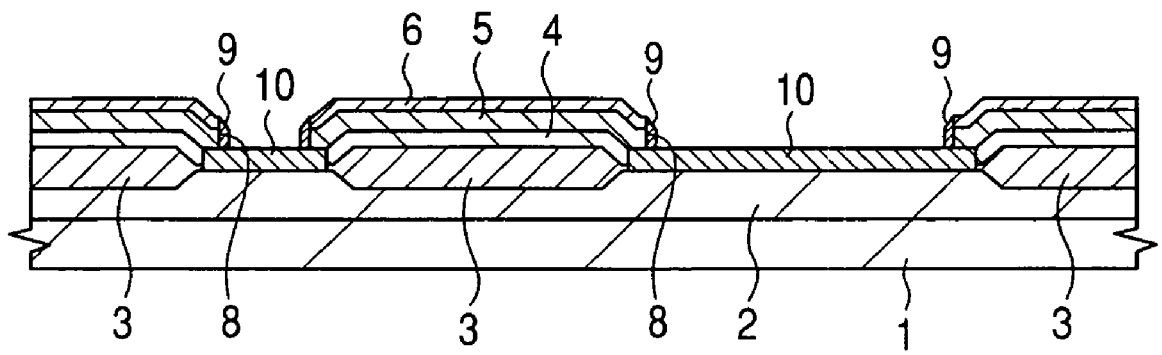
FIG. 7 is a cross-sectional view of an essential part of the same place in FIG. 1 showing a manufacturing step of the HBT which follows the manufacturing step shown in FIG. 6.

Next, as shown in FIG. 7, SiGe:C is selectively formed on the surface of the active region of the substrate 1 (n well 2) by epitaxial growth thus forming a base 10 of the HBT. Hereinafter, a forming method of selective SiGe:C is explained in detail.

Figure 8:
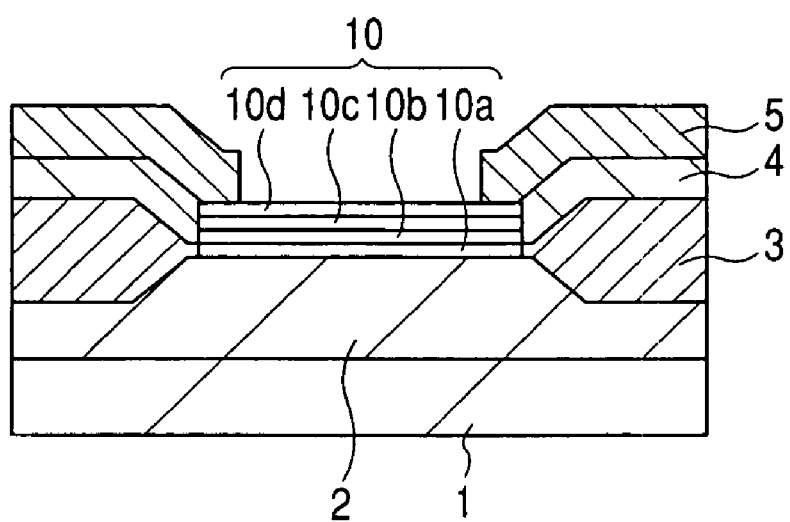
FIG. 8 is an enlarged view of an essential part of a substrate showing the base of the HBT according to the embodiment 1 of the present invention.

FIG. 8 shows an enlarged view of an essential part of the substrate which indicates the base. The base 10 includes, sequentially from bottom, SiGe:C (hereinafter, referred to as i-SiGe:C) 10a which forms an intrinsic semiconductor, SiGe:C (hereinafter, referred to as $p^+$-SiGe:C) 10b which forms a $p^+$ type semiconductor having a relatively high concentration, SiGe:C (hereinafter, referred to as $p^-$-SiGe:C) 10c which forms a $p^-$ type semiconductor having a relatively low concentration and Si10d. Thicknesses of i-SiGe:C10a, $p^+$-SiGe:C10b, $p^-$-SiGe:C10c and Si10d are, for example, respectively, approximately 3 to 30 nm, approximately 3 to 8 nm, approximately 3 to 10 nm and approximately 5 to 50 nm.

Figure 9:
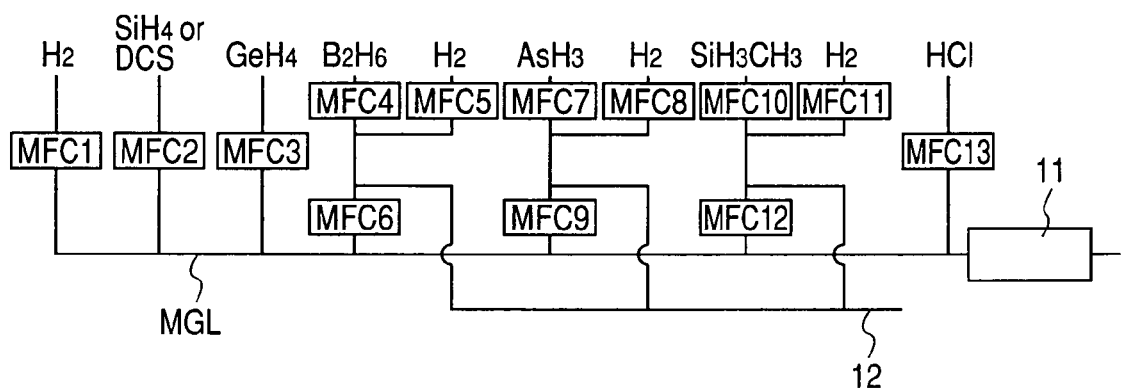
FIG. 9 is a view showing a piping structure of an epitaxial device which is used for forming the base of the HBT according to the embodiment 1 of the present invention.

FIG. 9 shows a piping structure of epitaxial device for forming a base of the HBT which constitutes the embodiment 1. Here, a single epitaxial device which performs processing for every one sheet of wafer is exemplified. However, a batch-type epitaxial device in which several sheets of wafers are collectively subjected to the simultaneous processing may be used (generally, in a wafer having a size equal to or more than 6 inches, that is, 150 mm, single epitaxial device is advantageous from a viewpoint of the uniformity in the inside of the wafer. However, from a view point of the processing ability, there arises a case that the batch-type is advantageous. When the size of wafer is equal to or more than 8 inches, that is, 200 mm or equal to or more than 12 inches, that is, 30 mm, the single epitaxial device is considered superior to the batch-type epitaxial device). To a main process gas line MGL which is connected with a chamber (reaction chamber) 11, respective gas lines which supply a gas in which H (hydrogen) atom or Cl (chlorine) atom is joined to $H_2$ atom and Si atom, for example, a gas which contains $SiH_4$, $Si_2H_6$ or DCS (Dichlorosilane: $SiH_2Cl_2$), Ge (for example, $GeH_4$), a gas which contains B (for example, $B_2H_6$), a gas which contains As (for example, $AsH_3$), a gas which contains C (for example, $SiH_3CH_3$) or the like are connected. Although, as a gas for supplying C, $SiH_3CH_3$ is used, $SiH_2(CH_3)_2$, $SiH(CH_3)_3$ or $Si(CH_3)_4$ may be also used. Although HCl is inevitable at the time of performing a selective epitaxial growth which uses a gas ($Si_xH_{2x+2}$) in which only H atom is joined to Si atom, HCl can be arbitrarily used at the time of using a gas which contains Cl atom such as DCS.

A flow rate of $H_2$ which forms a carrier gas is adjusted by a mass flow controller MFC1 and $H_2$ is made to flow in the main process gas line MGL and is supplied to the chamber 11 of the epitaxial device. In the same manner, a flow rate of $SiH_4$ or DSC is adjusted by a mass flow controller MFC2 and a flow rate of $GeH_4$ is adjusted by a mass flow controller MFC3, and these gasses are made to flow in the main process gas line MGL from respective gas lines and are supplied to the chamber 11. Further, in $B_2H_6$ which has a flow rate thereof adjusted by a mass flow controller MFC4, $H_2$ which has a flow rate thereof adjusted by a mass flow controller MFC5 is mixed thus $B_2H_6$ is diluted before being connected with the main process gas line MGL. The diluted $B_2H_6$ has a flow rate thereof adjusted by a mass flow controller MFC6 and is made to flow in the main process gas line MGL from the gas line and is supplied to the chamber 11. The undesired diluted $B_2H_6$ is discharged from a vent line 12. Further, to $AsH_3$ which has a flow rate thereof adjusted by a mass flow controller MFC7, $H_2$ which has a flow rate thereof adjusted by a mass flow controller MFC8 is mixed, and AsH$_3$ is diluted before being connected with the main process gas line MGL. The diluted AsH$_3$ has a flow rate thereof adjusted by a mass flow controller MFC9 and is made to flow in the main process gas line MGL from the gas line and is supplied to the chamber 11. The undesired diluted AsH$_3$ is discharged from a vent line 12. Further, to SiH$_3$CH$_3$ which has a flow rate thereof adjusted by a mass flow controller MFC10, H$_2$ which has a flow rate thereof adjusted by a mass flow controller MFC11 is mixed, and SiH$_3$CH$_3$ is diluted before being connected with the main process gas line MGL. The diluted SiH$_3$CH$_3$ has a flow rate thereof adjusted by a mass flow controller MFC12 and is made to flow in the main process gas line MGL from the gas line and is supplied to the chamber 11. The undesired diluted SiH$_3$CH$_3$ is discharged from a vent line 12.

The purity of H$_2$ for dilution is set to equal to or more than 99.99% (purity in a gas cylinder or cylinder at the time of purchasing), the concentration of O$_2$ is set to a value equal to or less than 3 ppm, the concentration of N$_2$ is set to a value equal to or less than 50 ppm, and H$_2$ is supplied by concentrated piping in a manufacturing plant. Further, before flowing into the epitaxial device, H$_2$ is made to pass through a hydrogen purifier (the device has an ability to remove oxygen-based impurity such as moisture, oxygen, carbon dioxide or the like and, after passing through this device, H$_2$ assumes a purity from 99.999% to 99.9999% or more) and the concentration of oxygen-based impurity of H$_2$ which is made to flow into a mass flow controller MFC11 assumes a value equal to or less than approximately 0.03 ppm (the purity is higher when compared with the purity of silane-based carbon-contained gas which forms a undiluted gas. However, existence of another harmful adding gas or the like is allowed).

SiH$_3$CH$_3$ is filled in the gas cylinder and is transported to a semiconductor manufacturing plant from a gas manufacturer. The concentration of oxygen-based impurity which is contained in SiH$_3$CH$_3$ having a concentration of 100% as a silane-based compound gas containing carbon is generally set to a value less than 10 ppm, however, at the time of forming SiGe:C by an epitaxial growth, the oxygen-based impurity is mixed into SiGe:C.

Figure 10:
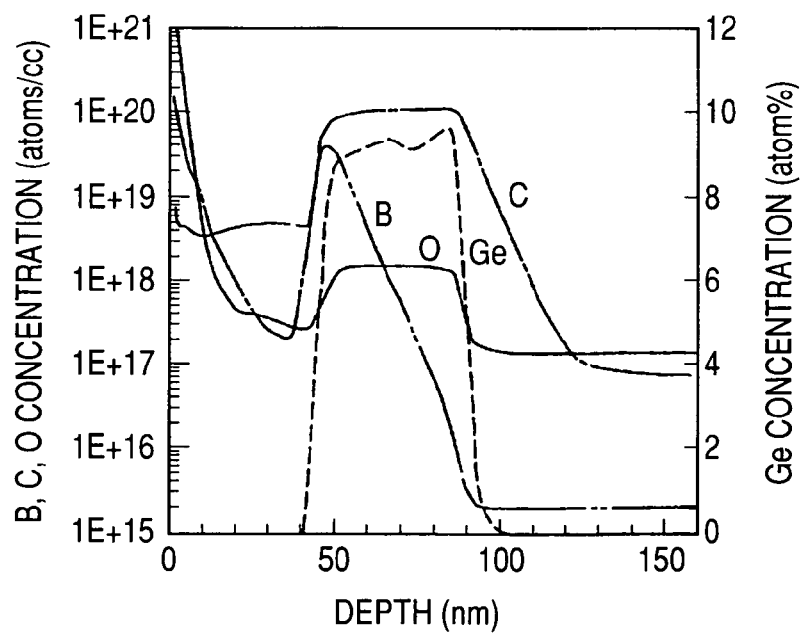
FIG. 10 is a SIMS profile of impurities of SiGe:C formed by an epitaxial growth using undiluted $SiH_3CH_3$.

FIG. 10 is a SIMS profile of impurity which is contained in SiGe:C formed by an epitaxial growth using undiluted SiH$_3$CH$_3$ having a concentration of 0.1%, and FIG. 11(a) is a SIMS profile of SiGe formed by an epitaxial growth without using SiH$_3$CH$_3$. As shown in FIG. 10, the remarkable increase of a concentration of O is observed at a portion of SiGe:C where Ge is introduced and the concentration of O assumes a value equal to or more than $10^{18}$ cm$^{-3}$. However, as shown in FIG. 11(a), in SiGe formed by the epitaxial growth, a concentration of the oxygen-based impurity assumes equal to or less than the detection limit. That is, it is assumed that, at the time of epitaxial growth of SiGe:C, the oxygen-based impurity which is contained in SiH$_3$CH$_3$ is stored in SiGe:C by Ge atom and the oxygen-based impurity is increased along with the increase of a concentration of Ge or a concentration of C. This is ensured by an experimental result that, in an experiment in which each of Ge or C is doped in a box shape during an epitaxial growth of Si as shown in FIG. 11(b), the concentration of the oxygen-based impurity is not increased. Accordingly, to reduce the oxygen-based impurity which is contained in SiGe:C, it is effective to reduce the concentration of Ge or the concentration of C. However, to form SiGe:C having a desired composition, it is not possible to reduce the concentration of Ge or the concentration of C.

Accordingly, in this embodiment 1, SiH$_3$CH$_3$ with high concentration is used, and SiH$_3$CH$_3$ is diluted with H$_2$ and, thereafter, the diluted SiH$_3$CH$_3$ is supplied to the chamber thus reducing the concentration of the oxide-based impurity introduced from SiH$_3$CH$_3$ in the inside of the chamber without reducing the C concentration whereby the concentration of the oxide-based impurity which the formed SiGe:C film contains can be reduced. Here, the high concentration implies that a value of the concentration falls within a range above 0.3% or more (in the present invention, in some cases, the high concentration means 1% or more, 2% or more or 5% or more depending on an object). As a range which is suitable for mass production, it is preferable to set the concentration of SiH$_3$CH$_3$ to a value which falls within a range from 0.5 to 10%. Further, it is optimum to set the concentration of SiH$_3$CH$_3$ to a value which falls within a peripheral range such as a range from 0.6 to 5% or the like having a center value at 1 to 2% (it is needless to say that the concentration of SiH$_3$CH$_3$ is not limited to such a range depending on other conditions). Further, the low concentration refers to a range below 0.2% and, in the mass production, a peripheral range which has a center value at 0.05 to 0.1% is applicable as a range of the low concentration (it is needless to say that the low concentration is not limited to such a range depending on other conditions).

Although the concentration of the oxide-based impurity which SiH$_3$CH$_3$ contains is set to 10 ppm irrespective of the concentration of SiH$_3$CH$_3$ in general, the theoretical oxide-based impurity concentration which the diluted SiH$_3$CH$_3$ contains is calculated. FIG. 12 shows one example of the SiH$_3$CH$_3$ concentration and the oxide-based impurity concentration collectively. The theoretical oxide-based impurity concentration is calculated such that 10 ppm×10%=1 ppm in case of SiH$_3$CH$_3$ having the diluted concentration of 10%, 10 ppm×5%=0.5 ppm in case of SiH$_3$CH$_3$ having the diluted concentration of 5%, 10 ppm×1%=0.1 ppm in case of SiH$_3$CH$_3$ having the diluted concentration of 1%, and 10 ppm×0.1%=0.01 ppmin case of SiH$_3$CH$_3$ having the diluted concentration of 0.1%. Accordingly, corresponding to the decrease of the SiH$_3$CH$_3$ concentration, the theoretical oxide-based impurity concentration is reduced.

FIG. 13 shows a reduction effect of the oxide-based impurity concentration when SiH$_3$CH$_3$ is diluted collectively. FIG. 13(a) shows the dilution effect when SiH$_3$CH$_3$ having the concentration of 1% is diluted with H$_2$, FIG. 13(b) shows the dilution effect when SiH$_3$CH$_3$ having the concentration of 5% is diluted with H$_2$, FIG. 13(c) shows the dilution effect when SiH$_3$CH$_3$ having the concentration of 10% is diluted with H$_2$, and FIG. 13(d) shows the concentration of the undiluted SiH$_3$CH$_3$ for comparison. To allow DN (Dopant Number: effective flow rate) of C in the diluted SiH$_3$CH$_3$ having concentration 1%, 5% or 10% to become 0.06, a flow rate (SCR) of SiH$_3$CH$_3$(MFC10), a flow rate (DIL) of H$_2$(MFC11) and a flow rate (INJ) of SiH$_3$CH$_3$(MFC12) which is diluted with H$_2$ and flows into a main process gas line MGL are changed. DN is defined by a following formula (1).

$$DN=INJ\times SCR/(SCR+DIL) \quad \text{formula (1)}$$

From FIG. 13, assuming that the SiH$_3$CH$_3$ concentration and the oxide-based impurity concentration are proportional to each other, provided that the flow rate (INJ) of the diluted SiH$_3$CH$_3$ is equal to the flow rate (SCR) of undiluted SiH$_3$CH$_3$ having the concentration of 0.1%, that is, the flow rate (INJ) and the flow rate (SCR) are the same 60 sccm, it is understood that an effect to reduce the oxide-based impurity cannot be obtained even when SiH$_3$CH$_3$ is diluted. However, when the flow rate (INJ) of the diluted SiH$_3$CH$_3$ is increased, the dilution effect appears reversely proportional to the flow rate (INJ) of the diluted $SiH_3CH_3$.

For example, assuming the flow rate (INJ) of the diluted $SiH_3CH_3$ as 300 sccm, when the $SiH_3CH_3$ having the concentration of 1%, 5% or 10% is diluted and used, the oxide-based impurity concentration can be reduced to 1/5 compared to the case in which the undiluted $SiH_3CH_3$ having the concentration of 0.1% is used. Further, assuming the flow rate (INJ) of the diluted $SiH_3CH_3$ as 600 sccm, when the $SiH_3CH_3$ having the concentration of 1%, 5% or 10% is diluted and used, the oxide-based impurity concentration can be reduced to 1/10 compared to the case in which the undiluted $SiH_3CH_3$ having the concentration of 0.1% is used.

A dilution ratio of $SiH_3CH_3$ can be determined using the flow rate (SCR) of $SiH_3CH_3$ and the flow rate (DIL) of $H_2$ and is expressed by SCR/(SCR+DIL) of the above-mentioned formula (1). Further, by determining the inverse number of the dilution ratio as the degree of dilution, a proper range of the degree of dilution is considered to be a range from 2 to 100 (it is needless to say that the degree of dilution is not limited to such a range depending on other conditions). A range from 3 to 50 is considered as a range suitable for mass production and a range from 4 to 20 is considered as an optimum range.

Here, approximately 20 slm of carrier gas ($H_2$) may be allowed to flow and hence, even when the flow rate (INJ) of the diluted $SiH_3CH_3$ is increased from 60 sccm to 300 sccm, a change rate is 240 sccm/20 slm=1.2%, while even when the flow rate (INJ) of the diluted $SiH_3CH_3$ is increased from 60 sccm to 600 sccm, a change rate is 540 sccm/20 slm=2.7%. Accordingly, it is considered that the epitaxial growth is not influenced by the increase of the flow rate (INJ) of $SiH_3CH_3$.

Further, when $SiH_3CH_3$ having the concentration of 1%, 5% or 10% is used in a diluted manner, it is possible to reduce a consumption amount and cost performance of $SiH_3CH_3$ compared to a case in which the undiluted $SiH_3CH_3$ having the concentration of 0.1% is used. FIG. 14(a) shows a comparison between the consumption amount of $SiH_3CH_3$ when $SiH_3CH_3$ having the concentration of 1%, 5% or 10% is used in a diluted manner in a state that the flow rate (INJ) of the diluted $SiH_3CH_3$ is 300 sccm and the consumption amount of $SiH_3CH_3$ when the undiluted $SiH_3CH_3$ having the concentration of 0.1% is used. FIG. 14(b) shows a comparison between the cost performance when $SiH_3CH_3$ having the concentration of 1%, 5% or 10% is used in a diluted manner in a state that the flow rate (INJ) of the diluted $SiH_3CH_3$ is 300 sccm and the cost performance when the undiluted $SiH_3CH_3$ having the concentration of 0.1% is used. Further, FIG. 14(c) shows a comparison of costs among $SiH_3CH_3$ having a concentration of 1%, 5% or 10% with respect to $SiH_3CH_3$ having the concentration of 0.1%. The cost performance is expressed by following formula (2).

Cost performance=cost ratio×flow rate ratio formula (2)

The $SiH_3CH_3$ consumption amount when $SiH_3CH_3$ having the concentration of 1%, 5% or 10% is used in a diluted manner becomes 1/6 of the $SiH_3CH_3$ consumption amount when the undiluted $SiH_3CH_3$ having the concentration of 0.1% is used and hence, the use amount of $SiH_3CH_3$ can be reduces by diluting $SiH_3CH_3$. Further, the cost performances when $SiH_3CH_3$ having the concentration of 1%, 5% or 10% are used in diluted manner are respectively 0.28, 0.39 and 0.49 and hence, costs when $SiH_3CH_3$ having the concentration of 1%, 5% or 10% is used in a diluted manner become approximately 30%, approximately 40% and approximately 50% when $SiH_3CH_3$ having the concentration of 0.1% is used.

Figure 15:
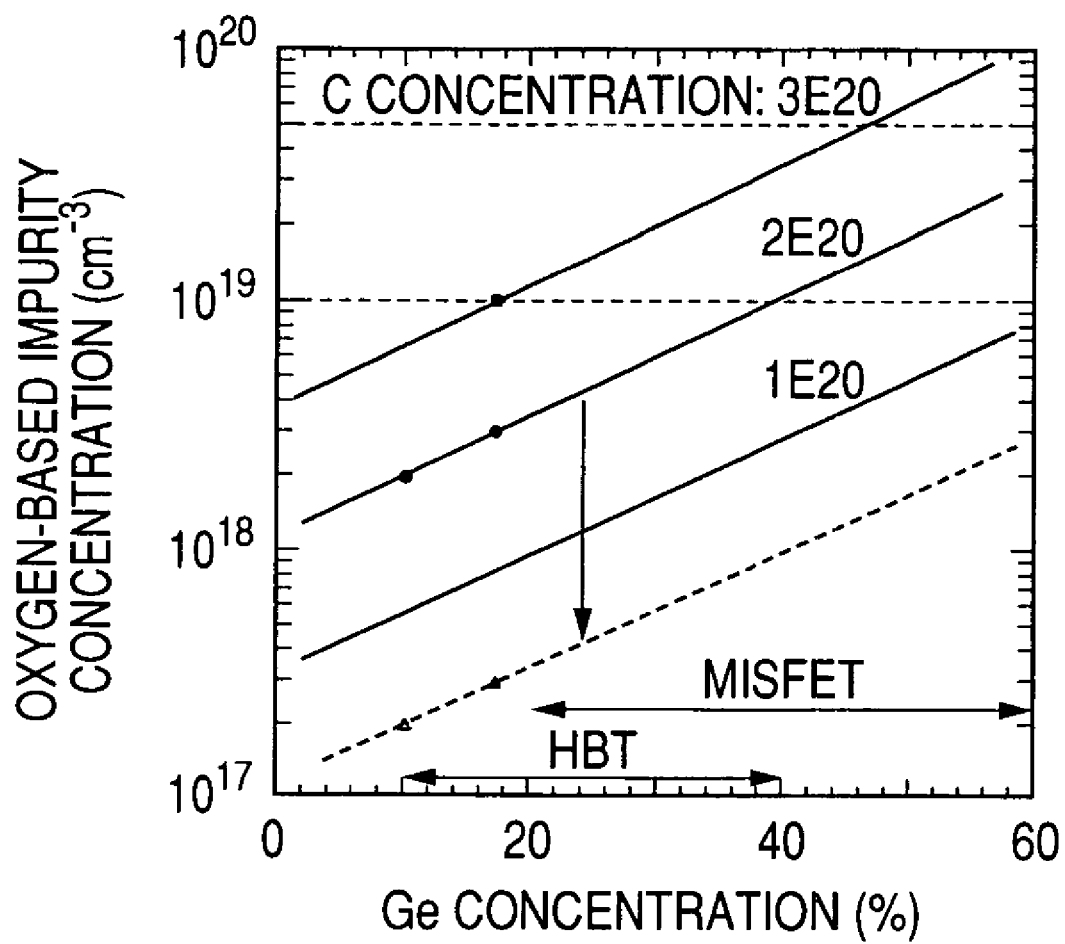
FIG. 15 is a graph showing the relationship between the concentration of oxygen-based impurity contained in SiGe:C and the concentration of Ge contained in SiGe:C using the C concentration as a parameter.

As mentioned previously, the oxide-based impurity which is taken into SiGe:C is increased corresponding to the increase of the Ge concentration or the C concentration (see the above-described FIG. 10 and FIG. 11). FIG. 15 shows the relationship between the concentrations of the oxide-based impurity and the Ge which are contained in SiGe:C using the C concentration as a parameter. In the drawing, a solid line indicates the oxide-based impurity concentration of SiGe:C which is formed using the undiluted $SiH_3CH_3$, and a broken line indicates the oxide-based impurity concentration of SiGe:C which is formed using the diluted $SiH_3CH_3$ having the high concentration.

For example, the concentration of Ge contained in SiGe:C which is used as a material of the base of the HBT may preferably be set to a value which falls within a range from 10 to 40% (It is needless to say that the Ge concentration is not limited to such a range depending on other conditions). The range suitable for mass production may be a range from 10 to 30%, while an optimum range may be a range from 15 to 20%. Further, the concentration of Ge contained in SiGe:C which is used as a material of a channel of the MIS•FET may preferably be set to a value which falls within a range from 20 to 60% (it is needless to say that the Ge concentration is not limited to such a range depending on other conditions). The range suitable for mass production may be a range from 20 to 40%, while an optimum range may be a range from 15 to 30%.

It is preferable to set the oxygen-based impurity concentration which may influence the HBT or the MIS•FET to a value equal to or more than $5 \times 10^{19}$ cm$^{-3}$. It is preferable to set the oxygen-based impurity concentration which can ignore the influence to the HBT or the MIS•FET to a value which falls within a range less than $5 \times 10^{19}$ cm$^{-3}$, for example (The oxygen-based impurity concentration is not limited to such a range depending on conditions). The range suitable for mass production may be equal to or below $1 \times 10^{19}$ cm$^{-3}$, while the optimum range is equal to or below $5 \times 10^{18}$ cm$^{-3}$.

For example, in the SiGe:C having the C concentration of $1 \times 10^{20}$ cm$^{-3}$ which is formed by the undiluted diluted $SiH_3CH_3$, for example, the oxygen-based impurity concentration becomes a value equal to or less than $1 \times 10^{19}$ cm$^{-3}$ with the Ge concentration within a range from 10 to 60% and this SiGe:C can be used as a material of the HBT or the MIS•FET. However, when the C concentration becomes higher than $1 \times 10^{20}$ cm$^{-3}$, due to the increase of oxygen-based impurity concentration, it is difficult to use the SiGe:C as a material of the base of the HBT or the channel of the MIS•FET. For example, in the SiGe:C having the C concentration of $2 \times 10^{20}$ cm$^{-3}$ which is formed using the undiluted diluted $SiH_3CH_3$, the oxygen-based impurity concentration with the Ge concentration of equal to less than 40% becomes a value equal to or less than $1 \times 10^{19}$ cm$^{-3}$ and hence, the SiGe:C may be used as a material of the HBT. On the other hand, when the Ge concentration exceeds 40%, the oxygen-based impurity concentration becomes equal to or more than $1 \times 10^{19}$ cm$^{-3}$ and hence, depending on the demanding characteristic, it is difficult to use the SiGe:C in the MIS•FET in general. Further, in the SiGe:C having the C concentration of $3 \times 10^{20}$ cm$^{-3}$ which is formed using the undiluted $SiH_3CH_3$, when the Ge concentration exceeds 17%, the oxygen-based impurity concentration becomes equal to or more than $1 \times 10^{19}$ cm$^{-3}$ and hence, depending on the demanding characteristic, it is difficult to use the SiGe:C in the base of the HBT or the channel of the MIS•FET in general.

Accordingly, by using the $SiH_3CH_3$ having the concentration of 1%, 5% or 10% in a diluted manner, the concentration of the oxygen-based impurity contained in the SiGe:C is lowered without changing the C concentration. FIG. 15 shows, as an example, the relationship between the the concentration of the oxygen-based impurity and the Ge contained in the SiGe:C having the C concentration of $2 \times 10^{20}$ cm$^{-3}$ which reduces the concentration of the oxygen-based impurity to $\frac{1}{10}$ is shown. For lowering the oxygen-based impurity concentration, the diluted SiH$_3$CH$_3$ having the concentration of 1%, 5% or 10% is used. By reducing the oxygen-based impurity concentration to $\frac{1}{10}$, it is possible to set the oxygen-based impurity concentration to a value equal to or less than $1 \times 10^{19}$ cm$^{-3}$ even when the concentration of the Ge is 60% and hence, it is also possible to use SiGe:C having the C concentration of $2 \times 10^{20}$ cm$^{-3}$ in the channel of the MIS•FET which requires the Ge concentration of 20 to 60%. In the same manner, in the SiGe:C having the C concentration of $3 \times 10^{2}$ cm$^{-3}$, it is possible to reduce the oxygen-based impurity concentration to $\frac{1}{10}$ and hence, the SiGe:C can be used as the material of the base of the HBT or the channel of the MIS•FET.

Figure 16:
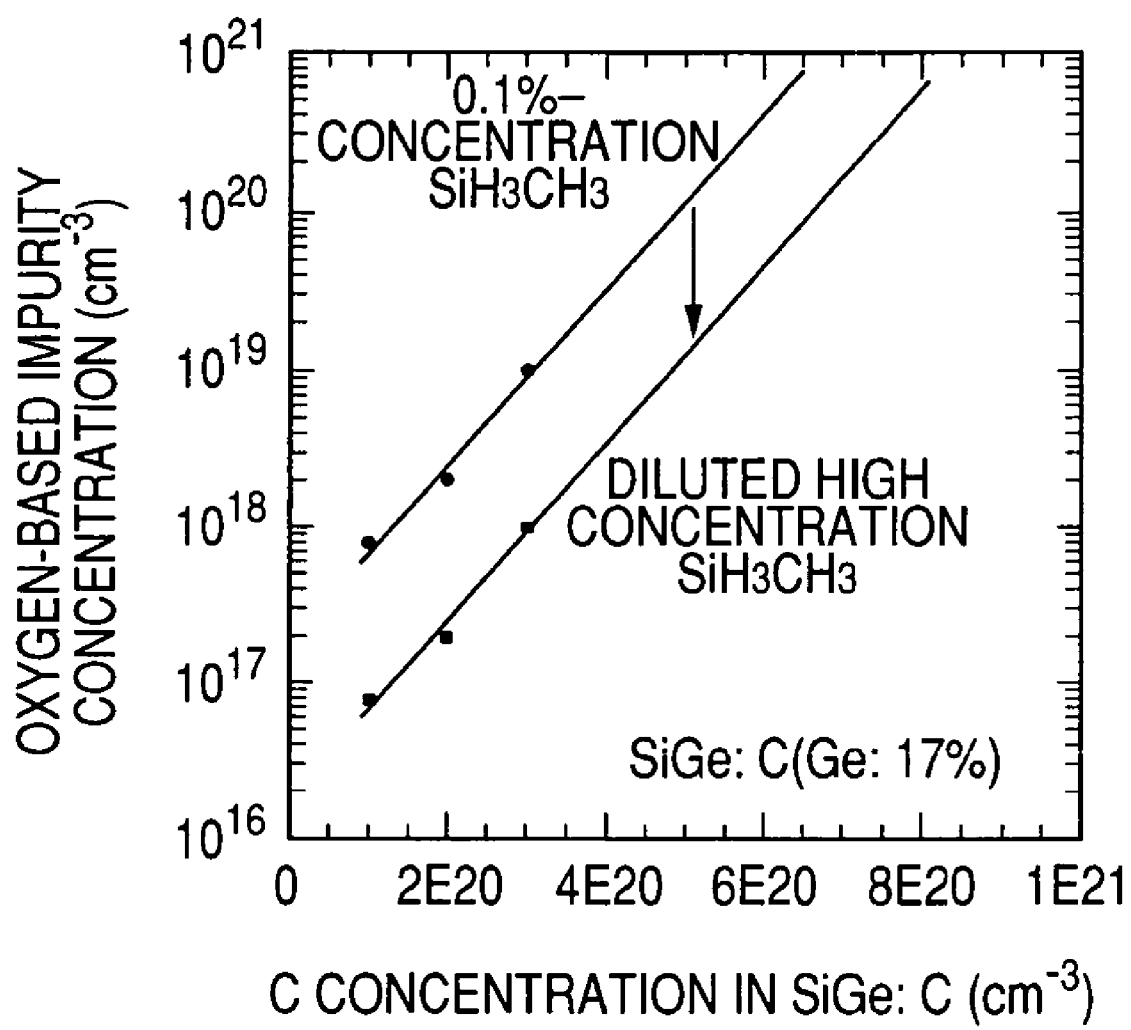

FIG. 16 shows the relationship between the concentrations of the oxygen-based impurity and the C which are contained in the SiGe:C which is formed using the undiluted diluted SiH$_3$CH$_3$ and the SiGe:C which is formed using the diluted SiH$_3$CH$_3$ having the high concentration. The Ge concentration is 17%, and the concentration of oxygen-based impurity contained in the SiGe:C which is formed by the diluted SiH$_3$CH$_3$ having the high concentration is set to $\frac{1}{10}$ of the concentration of oxygen-based impurity contained in the SiGe:C which is formed using the undiluted diluted SiH$_3$CH$_3$.

Even when the Ge concentration is constant, when the C concentration is increased, the oxygen-based impurity concentration contained in the SiGe:C is increased. In the SiGe:C which is formed using the undiluted SiH$_3$CH$_3$, when the C concentration exceeds $3 \times 10^{20}$ cm$^{-3}$, the oxygen-based impurity concentration becomes a value equal to or more than $1 \times 10^{19}$ cm$^{-3}$ and hence, it is difficult to use the SiGe:C in the base of the HBT or the channel of the MIS•FET. However, In the SiGe:C which is formed using the diluted SiH$_3$CH$_3$ having the high concentration, when the C concentration exceeds $5 \times 10^{20}$ cm$^{-3}$, the oxygen-based impurity concentration become a value equal to or more than $1 \times 10^{19}$ cm$^{-3}$ and hence, it is possible to increase the concentration of C contained in the SiGe:C than the concentration of SiGe:C which is formed using the undiluted diluted SiH$_3$CH$_3$.

Figure 18:
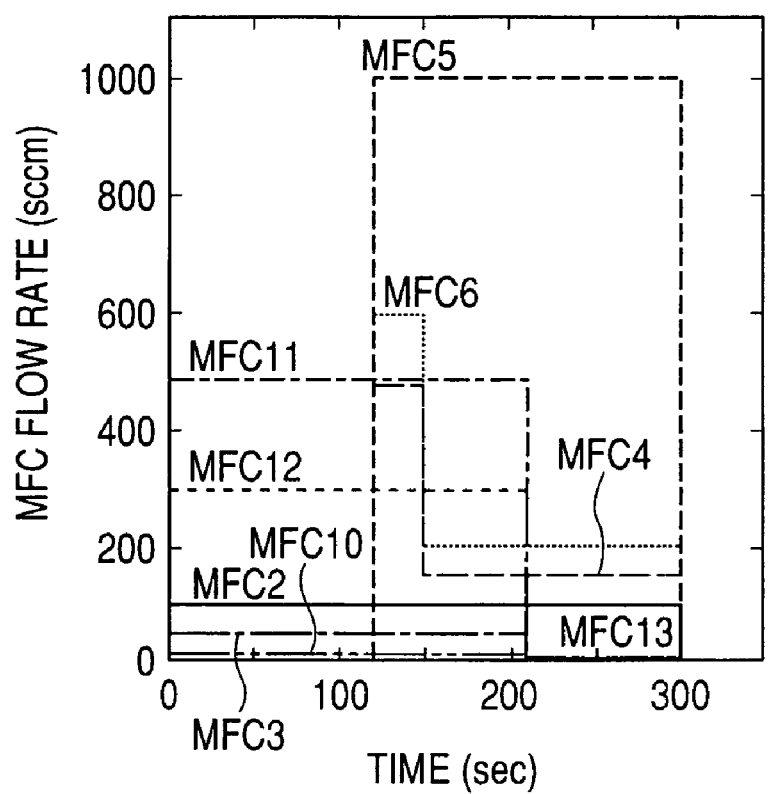
FIG. 18 is a graph showing the relationship between a gas flow rate adjusted by respective mass flow controllers and time (Duration) according to the embodiment 1 of the present invention.

Next, the explanation is made with respect to one example of a process sequence for forming the base of the HBT which constitutes this embodiment 1. FIG. 17 shows one example of gas flow rates which are controlled by respective mass flow controllers (see FIG. 9) in an epitaxial growth, while FIG. 18 shows the relationship between the gas flow rates which are controlled by respective mass flow controllers and time (duration). The base of the HBT has the stacked structure in which i-SiGe:C, p$^+$-SiGe:C, p$^-$-SiGe:C and Si are formed from below in order by an epitaxial growth. In forming the i-SiGe:C, the p$^+$-SiGe:C and the p$^-$-SiGe:C, the SiH$_3$CH$_3$ having the concentration of 1% is used. Here, to use p-type as the conductive type of the base, the mass flow controllers MFC4, 5, 6 are opened to supply B to the SiGe:C, while the mass flow controllers MFC7, 8, 9 are closed to stop the supply of As.

As shown in FIG. 17 and FIG. 18, by adjusting the mass flow controllers MFC, it is possible to supply desired gases at desired flow rates to the chamber. Here, H$_2$ is used as the carrier gas and a constant flow rate (20 slm) of carrier gas is made to flow through the mass flow controller MFC1. First of all, SiH$_4$ (or DCS) and GeH$_3$ passes the mass flow controllers MFC2, 3 and is supplied to the chamber for 120 seconds thus forming the i-SiGe:C. Next, B$_2$H$_2$ which is diluted with SiH$_4$, GeH$_4$ and H$_2$ pass the mass flow controllers MFC2, 3, 4, 5, 6 and are supplied to the chamber for 30 seconds thus forming the p$^+$-SiGe:C. Subsequently, B$_2$H$_2$ which is diluted with SiH$_4$, GeH$_4$ and H$_2$ passes the mass flow controllers MFC2, 3, 4, 5, 6 and is supplied to the chamber for 60 seconds thus forming the p$^-$-SiGe:C. In forming these SiGe:Cs, the SiH$_3$CH$_3$ having the concentration of 1% and diluted with H$_2$ passes the mass flow controllers MFC10, 11, 12 and is supplied to the chamber. Accordingly, it is possible to reduce the oxygen impurities contained in the i-SiGe:C, the p$^+$-SiGe:C and the p$^-$-SiGe:C without lowering the concentration of C. Next, B$_2$H$_2$ which is diluted with SiH$_4$ and H$_2$ passes the mass flow controllers MFC2, 4, 5, 6 and is supplied to the chamber for 90 seconds thus forming the Si. When the DCS is used, the use of HCl is arbitrary. When the SiH$_4$ is used, the use of HCl becomes indispensable to ensure the selectivity.

Figure 19:
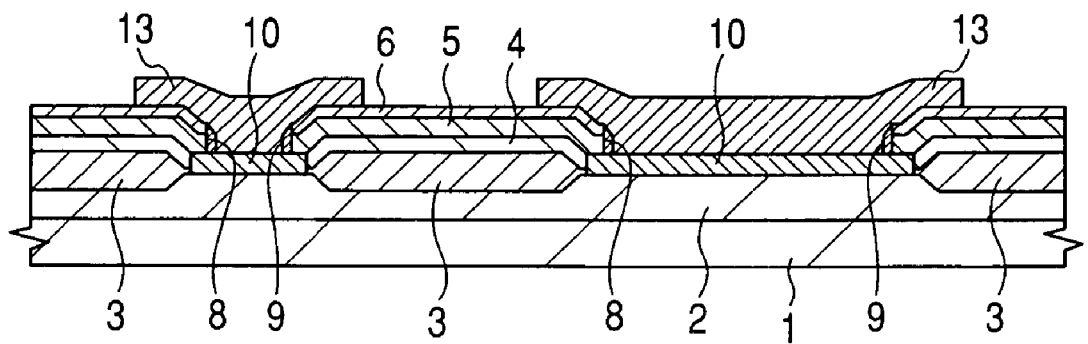
FIG. 19 is a cross-sectional view of an essential part of the same place in FIG. 1 showing a manufacturing step of the HBT which follows the manufacturing step shown in FIG. 7.

Next, as shown in FIG. 19, a silicon poly-crystalline film 13 to which the n-type impurity such as P (phosphorous), for example, is added is stacked on the substrate 1 and, subsequently, the silicon poly-crystalline film 13 is etched using a patterned resist as a mask. The formed silicon poly-crystalline film 13 forms an emitter of the HBT. Thereafter, an interlayer insulation film and a wiring layer are formed on the silicon poly-crystalline film 13 thus forming the HBT. However, the illustration in the drawing and the explanation of these parts are omitted.

Here, in the embodiment 1, the base of the HBT adopts the stacked structure which is formed of the i-SiGe:C, the p$^+$-SiGe:C, the p$^-$-SiGe:C and the Si. However, the base of the HBT is not limited to such structure and may adopt the stacked structure which is formed of, for example, the i-SiGe:C, the p$^+$-SiGe:C and the Si.

Further, in the embodiment 1, before being mixed with other process gases, the SiH$_3$CH$_3$ having the high concentration is diluted with H$_2$ and the diluted SiH$_3$CH$_3$ is made to flow into the main process gas line MGL and is supplied to the chamber whereby the oxygen-based impurity concentration contained in the SiGe:C is reduced. However, the method which reduces the oxygen-based impurity contained in the SiH$_3$CH$_3$ which is made to flow into the main process gas line MGL is not limited to such a method.

Figure 20A:
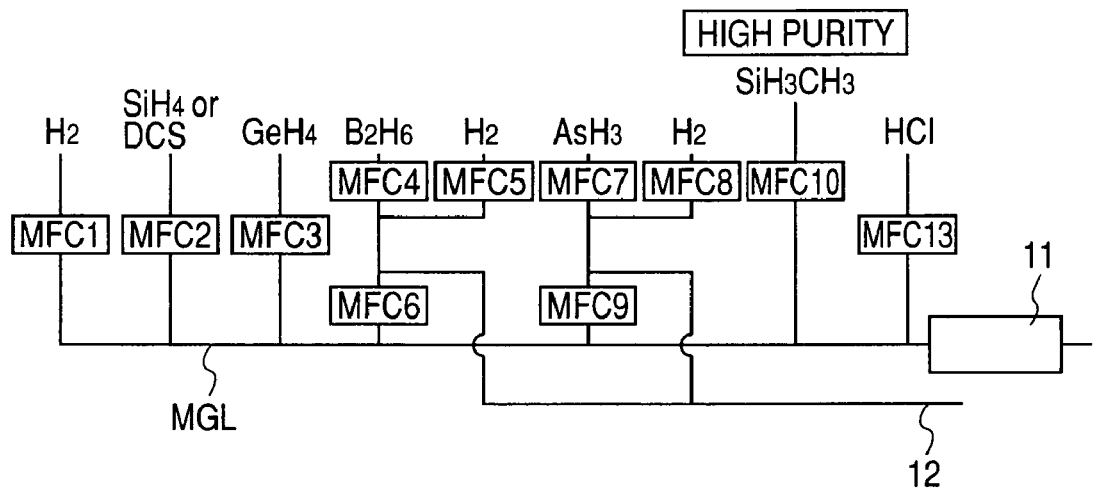
FIG. 20(a) is a view showing a piping structure of an epitaxial device which adopts $SiH_3CH_3$ of high impurity of the embodiment 1 of the present invention.

For example, there is provided a method which adopts SiH$_3$CH$_3$ having high purity (low oxygen-based impurity concentration). FIG. 20(*a*) shows the piping structure of an epitaxial device which adopts the SiH$_3$CH$_3$ having high purity. This method has a drawback that when the purity of the SiH$_3$CH$_3$ is increased, a cost of the SiH$_3$CH$_3$ is pushed up. However, this method has an advantage that a desired characteristic can be obtained by merely changing gasses. In this case, a carbon-containing silane-based compound gas having the low concentration of less than 0.2% (diluted with a hydrogen gas or the like) is generally used. However, it may be possible to use a carbon-containing silane-based compound gas having the middle concentration which falls within a range more than 0.2% and less than 0.3%. Further, in the same manner as the above-mentioned embodiment, it may be possible to use a carbon-containing silane-based compound gas having the high concentration, that is, more than 0.3% (further, when necessary, more than 0.6%, 1%, 2%, 5%). When the carbon-containing silane-based compound gas having the middle concentration or the high concentration is used, in the same manner as the above-mentioned embodiment, before being introduced into the reaction chamber, the carbon-containing silane-based compound gas is diluted with hydrogen or the like and only a portion of the gas is introduced into the reaction chamber whereby the impurity concentration is lowered.

Figure 21:
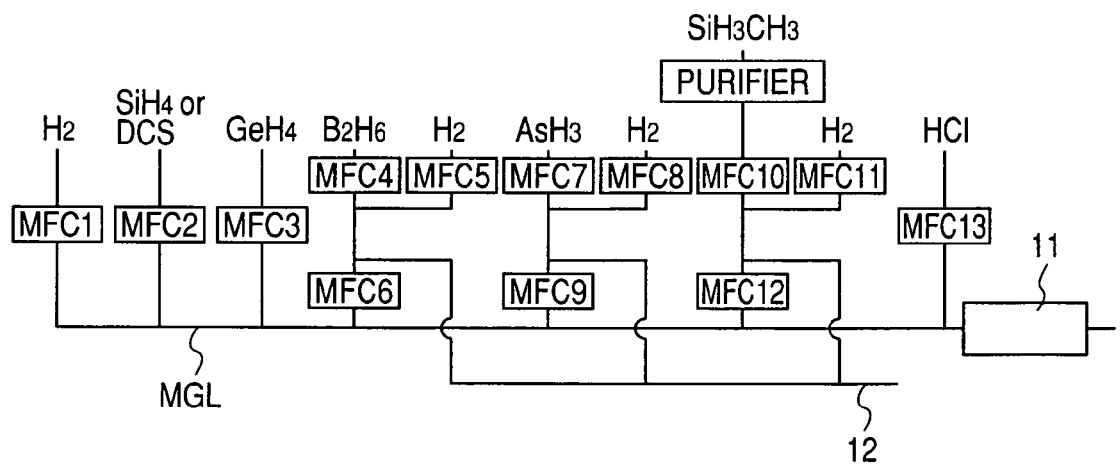
FIG. 21 is a view showing a piping structure of an epitaxial device to which a purifier is added according to the embodiment 1 of the present invention.

Further, as shown in FIG. 21, in place of using the carbon-containing silane-based compound gas having the high concentration, a usual carbon-containing silane-based compound gas may be made to pass through a gas purifier or a filter (an oxygen-based impurity removing device for carbon-containing silane-based compound gas) which is connected with an epitaxial device and has an ability to remove the oxygen-based impurity and, then, the gas may be supplied to the reaction chamber. In this case, the oxygen-based impurity removing device for carbon-containing silane-based compound gas may be expensive compared with a corresponding device for hydrogen, the device has an advantage that a relatively inexpensive gas can be used. It is needless to say that a gas having high purity may be used. The dilution and a partial introducing method (combination) can be also used.

Figure 20B:
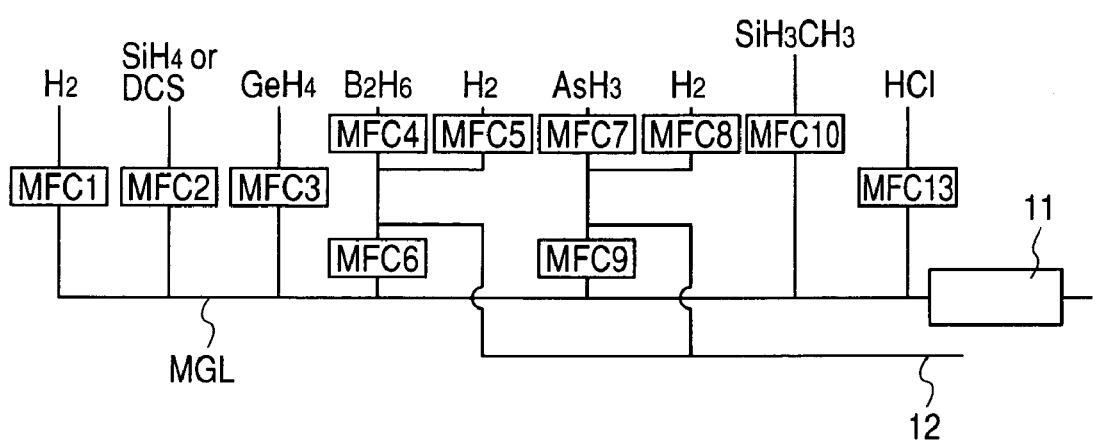
FIG. 20(b) is a view showing a piping structure of an epitaxial device which adopts the dilution of $SiH_3CH_3$ using a carrier gas of the embodiment 1 of the present invention.

Further, there is also provided a method which allows a large amount of carrier gas to flow into the main process guide line MGL. FIG. 20(b) shows the piping structure of an epitaxial device which adopts the dilution of $SiH_3CH_3$ with the carrier gas. In this method, to obtain the same concentration as the concentration of the method (see FIG. 9) which dilutes the $SiH_3CH_3$ before the $SiH_3CH_3$ is made to flow into the main process gas line MGL by diluting the $SiH_3CH_3$ from $1/10$ to $1/100$, it is necessary to increase the flow rate of the carrier gas from 10 times to 100 times. Accordingly, it is necessary to increase an ability of an exhaust pump from 10 times to 100 times.

In this manner, according to this embodiment 1, the $SiH_3CH_3$ having the high concentration is diluted with $H_2$ and the $SiH_3CH_3$ is supplied to the chamber of the epitaxial device at the predetermined flow rate and hence, the concentration of the oxygen-based impurity in the inside of the chamber is reduced whereby the concentration of the oxygen-based impurity which is contained in the selective SiGe:C formed in a film is reduced to the value equal to or less than $1 \times 10^{19}$ $cm^{-3}$. Accordingly, even when the selective SiGe:C is used as the material of the base of the HBT, it is possible to prevent the lowering of the lifetime of the carrier attributed to the oxygen-based impurity. As a result, the re-coupling current in the base can be reduced thus reducing a base current and hence, it is possible to enhance the hFE compared to a case in which the $SiH_3CH_3$ having the low concentration is supplied to the chamber without being diluted. Further, since the crystalline defect attributed to the oxygen atoms can be reduced, a leaked current of the SiGe:C can be reduced.

That is, as explained in the above-mentioned embodiment and as will be explained in an embodiment explained hereinafter, the concentration of the hydrogen-based gas which is introduced into the reaction chamber and contains the carbon-atom-containing silane-based compound gas is set higher than the concentration used in the reaction chamber. Before being introduced into the reaction chamber, the above-mentioned gas having the high concentration (not limited to the gas having the concentration of the value equal to or more than 0.3%) is diluted to the concentration in the reaction chamber with the hydrogen-based gas (when necessary, the gas based on various atoms or molecules being used) and is introduced into the reaction chamber. In this case, when necessary, a portion of the diluted carbon-atom-containing silane-based compound gas may be introduced into the reaction chamber.

In this manner, with the use of the raw material gas having the high concentration in a diluted manner, it is possible to reduce drawbacks attributed to a trace amount (order of ppm) of oxygen-based impurity gas which is unavoidably mixed into the raw material gas in the course of manufacturing the raw material gas.

Embodiment 2

The manufacturing method of HBT of this embodiment 2 which uses the non-selective SiGe:C as the material of the base of the HBT is explained in order of steps in conjunction with FIG. 22 to FIG. 27. In the embodiments 2 and 3 described hereinafter, it is needless to say that unless otherwise specified, besides the SiGe:C layer forming method which is particularly specified, any examples disclosed in the embodiment 1 are applicable to the embodiments 2, 3.

Figure 22:
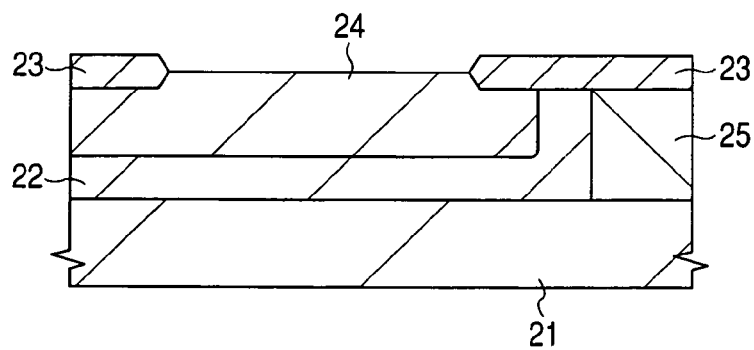
FIG. 22 is a cross-sectional view of an essential part of a substrate showing a manufacturing step of a HBT which uses a nonselective SiGe:C as a base according to an embodiment 2 of the present invention.

First of all, as shown in FIG. 22, a substrate 21 is prepared. The substrate 21 is made of silicon single-crystal and has the resistivity of 3 to 6 mΩcm, for example. Subsequently, using an epitaxial growth method, an n-type epitaxial layer 22 having a thickness of approximately 0.5 μm is formed on the substrate 21. Next, a LOCOS oxide film 23 having a thickness of 200 to 500 nm is formed on an element isolation region of the substrate 21 and, thereafter, an n-type impurity, for example, P is injected by ion implantation into a predetermined region of the epitaxial layer 22 thus forming an n-well 24. In the same manner, a p-type impurity, for example, B is injected by ion implantation into a predetermined region of the epitaxial layer 22 thus forming a p-well 25.

Figure 23:
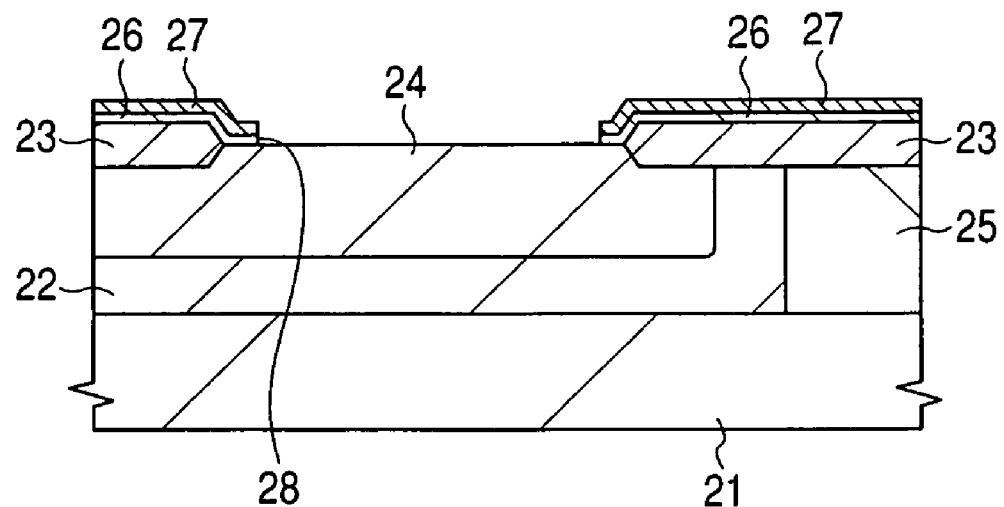
FIG. 23 is a cross-sectional view of an essential part of the same place in FIG. 22 showing a manufacturing step of the HBT which follows the manufacturing step shown in FIG. 22.

Next, as shown in FIG. 23, an insulation film 26 having a thickness of approximately 10 to 50 nm is formed on the substrate 1 by a thermal oxidation method, for example, and, thereafter, a silicon poly-crystalline film 27 having a thickness of approximately 10 to 50 nm is formed on the insulation film 26 by a CVD method, for example. Subsequently, using a patterned resist as a mask, the silicon poly-crystalline film 27 and the insulation film 26 are sequentially etched thus exposing the substrate 21 (n-well 24) of an active region where the HBT is formed and forming a base opening portion 28.

Figure 24:
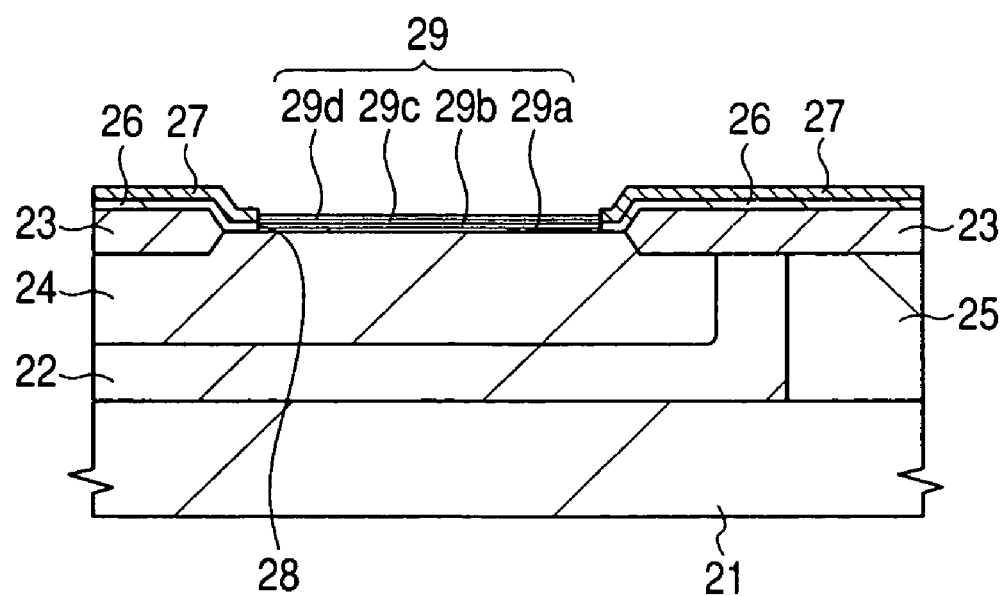
FIG. 24 is a cross-sectional view of an essential part of the same place in FIG. 22 showing a manufacturing step of the HBT which follows the manufacturing step shown in FIG. 23.

Next, as shown in FIG. 24, on the substrate 21, the SiGe:C is formed by a non-selective epitaxial growth thus forming a base 29 of the HBT. The base 29 adopts, in the same manner as the base 10 of the HBT of the above-mentioned embodiment 1, the stacked structure which is formed of an i-SiGe:C 29a, $p^+$-SiGe:C 29b, $p^-$-SiGe:C 29c and Si 29d. In forming the i-SiGe:C 29a, the $p^+$-SiGe:C 29b, the $p^-$-SiGe:C 29c and the Si 29d, the epitaxial device having the piping shown in FIG. 9 of the above-mentioned embodiment 1 is used. That is, in forming the i-SiGe:C 29a, the $p^+$-SiGe:C 29b and the $p^-$-SiGe:C 29c by the non-selective epitaxial growth, in the same manner as the selective epitaxial growth, the $SiH_3CH_3$ having the high concentration is diluted with $H_2$ and the diluted $SiH_3CH_3$ is made to flow in a main process gas line and is supplied to a chamber of the epitaxial device. Accordingly, the concentration of the oxygen-based impurity introduced into the inside of the chamber is reduced and hence, it is possible to reduce the concentration of the oxygen-based impurity which is contained in the SiGe:C formed in a film can be reduced to $1 \times 10^{19}$ $cm^{-3}$.

Figure 25:
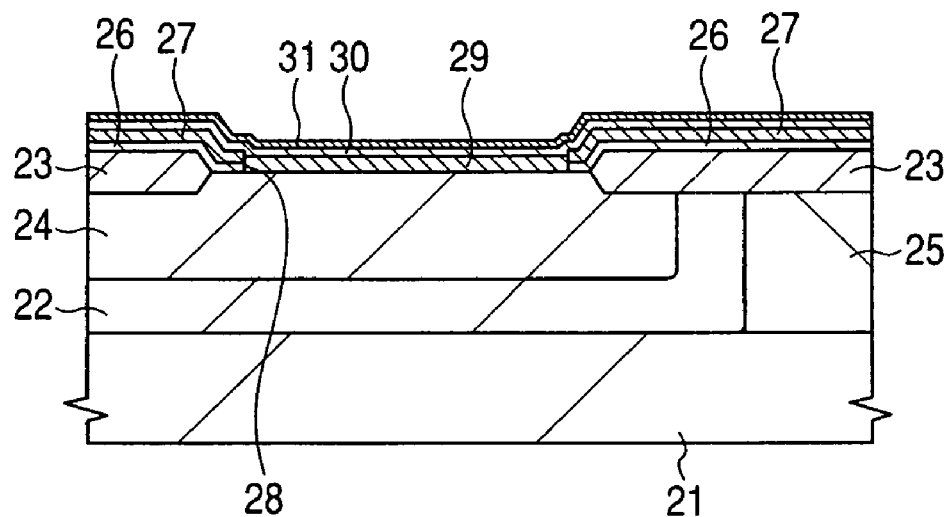
FIG. 25 is a cross-sectional view of an essential part of the same place in FIG. 22 showing a manufacturing step of the HBT which follows the manufacturing step shown in FIG. 24.

Next, as shown in FIG. 25, an insulation film 30 and a silicon poly-crystalline film 31 are sequentially stacked on the substrate 21 by a CVD method, for example. Here, the insulation film 30 and the silicon poly-crystalline film 31 have thicknesses of approximately 30 to 80 nm, for example.

Figure 26:
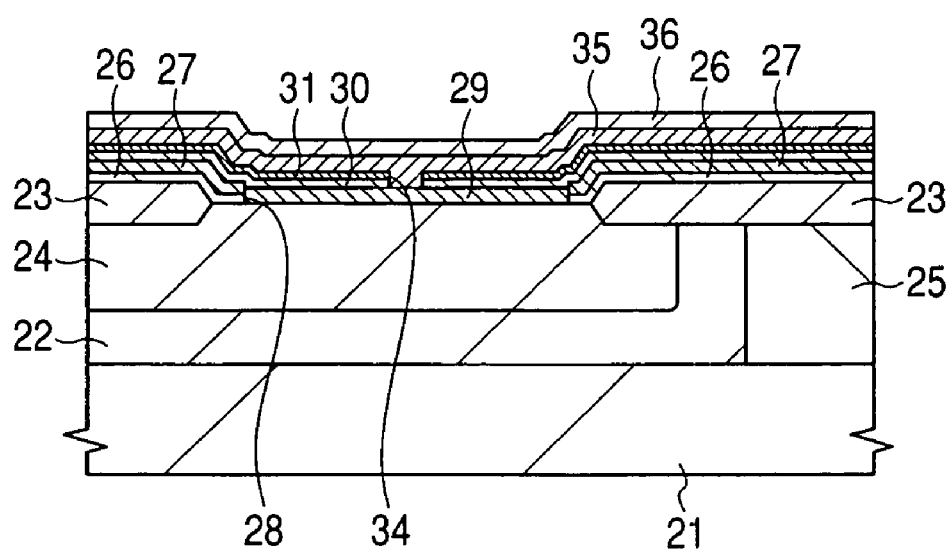
FIG. 26 is a cross-sectional view of an essential part of the same place in FIG. 22 showing a manufacturing step of the HBT which follows the manufacturing step shown in FIG. 25.

Next, as shown in FIG. 26, by using the patterned resist as a mask, a silicon poly-crystalline film 31 and an insulation film 30 are sequentially etched and a portion of the base 29 is exposed thus forming an emitter opening portion 34. Subsequently, a silicon poly-crystalline film 35 and an insulation film 36 to which an n-type impurity, for example, P is added are sequentially stacked on the substrate 21 by the CVD method, for example. The silicon poly-crystalline film 35 and the insulation film 36 have thicknesses of approximately 100 to 300 nm, for example.

Figure 27:
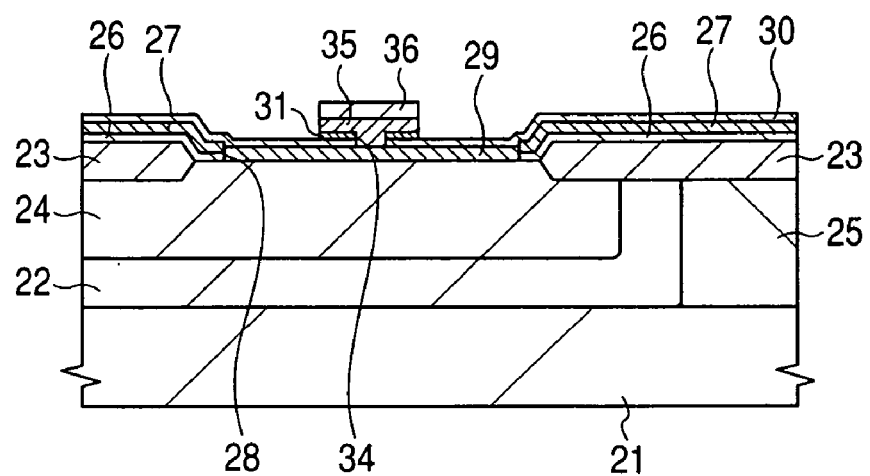
FIG. 27 is a cross-sectional view of an essential part of the same place in FIG. 22 showing a manufacturing step of the HBT which follows the manufacturing step shown in FIG. 26.

Next, as shown in FIG. 27, the insulation film 36 and the silicon poly-crystalline film 35 are sequentially etched by using the patterned resist as a mask. The formed silicon poly-crystalline film 36 forms an emitter of the HBT. Thereafter, on the further upper layer, an inter-layer insulation film and a wiring layer are formed thus forming the HBT. However, the illustration in the drawings and the explanation of these parts are omitted.

In this manner, according to the embodiment 2, also in non-selective epitaxial growth, $SiH_3CH_3$ having a high concentration is diluted with $H_2$ and hence, it is possible to decrease a concentration of the oxygen-based impurity which is introduced into the chamber of the epitaxial device. Accordingly, it is possible to reduce a concentration of the oxygen-based impurity which is contained in a non-selective SiGe:C which is formed as a film to a value equal to or less than $1 \times 10^{19}$ cm$^{-3}$.

Embodiment 3

Figure 28:
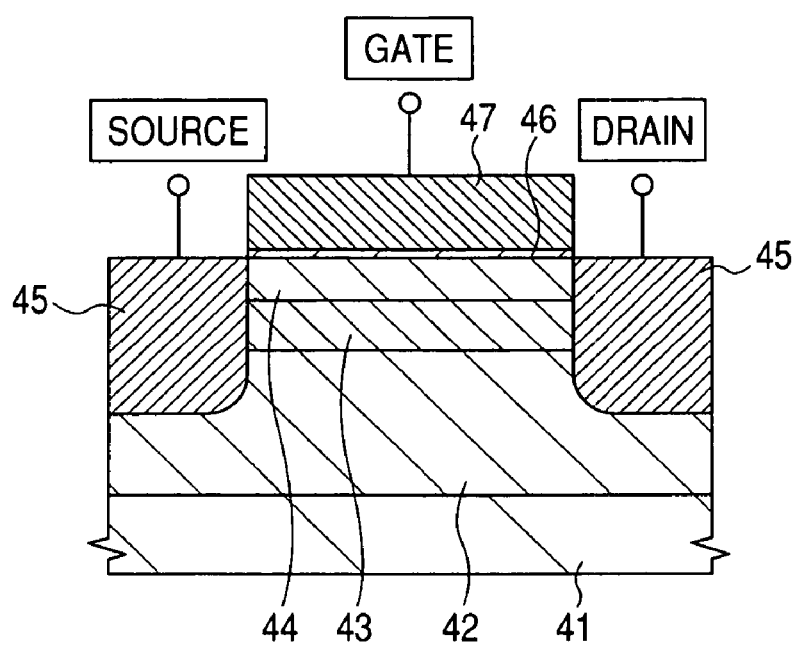
FIG. 28 is a cross-sectional view of an essential part of a substrate showing an n-channel MIS•FET which forms a channel using a strain SiGe:C of an embodiment 3 of the present invention.

The n-channel MIS•FET which uses SiGe:C of the embodiment 3 as a channel is shown in FIG. 28.

A p-type epitaxial layer 42 having a thickness of approximately 0.5 μm is formed on a substrate 41 which is made of an p-type silicon single crystallin and, further, a channel of an n-channel MIS•FET is formed on the p-type epitaxial layer 42. The channel has the structure in which an p-type SiGe:C43 and Si44 to which B is added from below are sequentially stacked. Here, SiGe:C43 has a thickness of approximately 0.2 nm, for example, and Si44 has a thickness of approximately 0.1 nm, for example. SiGe:C43 and Si44 are formed by an epitaxial growth method in which the oxygen-based impurity which is introduced into the epitaxial device is reduced by diluting $SiH_3CH_3$ having the high concentration with $H_2$.

On both sides of the channel, a source and a drain are formed by a pair of n-type semiconductor regions 45. Further, on the channel, a gate insulation film 46 which is made of a silicon oxide film is formed and, further, a gate electrode 47 which is made of a silicon poly-crystalline film to which a p-type impurity is introduced is formed on the gate insulation film 46.

Figure 29:
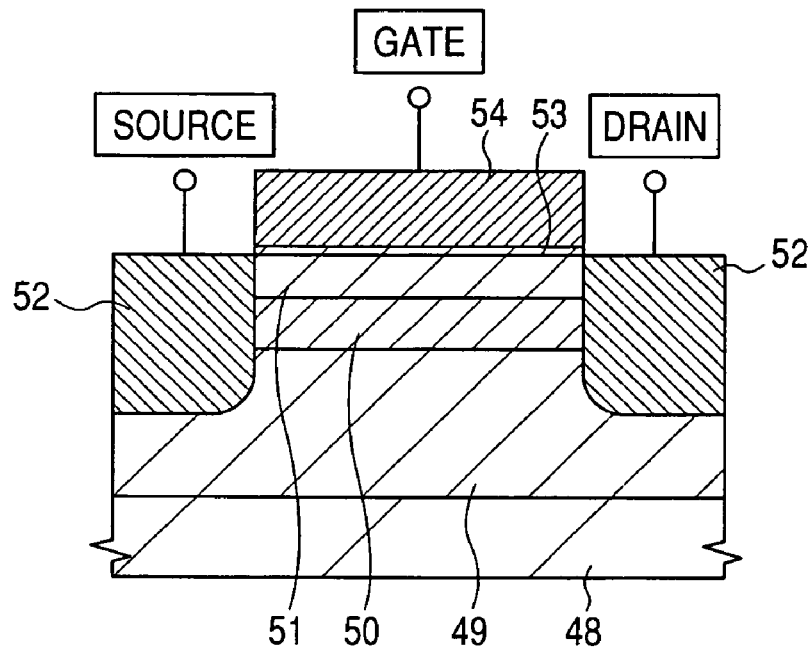
FIG. 29 is a cross-sectional view of an essential part of a substrate showing a p-channel MIS•FET which forms a channel using a strain SiGe:C of the embodiment 3 of the present invention.

The p-channel MIS•FET which uses SiGe:C of the embodiment 3 as a channel is shown in FIG. 29.

A p-type epitaxial layer 49 having a thickness of approximately 0.5 μm is formed on a substrate 48 which is made of an n-type silicon single crystallin and, further, a channel of a p-channel MIS•FET is formed on the p-type epitaxial layer 49. The channel has the structure in which an n-type SiGe:C50 and Si51 to which As is added from below are sequentially stacked. SiGe:C50 has a thickness of approximately 0.2 nm, for example, and Si51 has a thickness of approximately 0.1 nm, for example. SiGe:C50 and Si51 are formed by an epitaxial growth method in which the oxygen-based impurity which is introduced into the epitaxial device is reduced by diluting $SiH_3CH_3$ having the high concentration with $H_2$.

On both sides of the channel, a source and a drain are formed by a pair of p-type semiconductor regions 52. Further, on the channel, a gate insulation film 53 which is made of a silicon oxide film is formed and, further, a gate electrode 54 which is made of a silicon poly-crystalline film to which an n-type impurity is introduced is formed on the gate insulation film 53.

A manufacturing method of the n-channel MIS•FET which uses a non-selective SiGe:C of the embodiment 3 as the channel is explained in order of steps in conjunction with FIG. 30 to FIG. 34.

Figure 30:
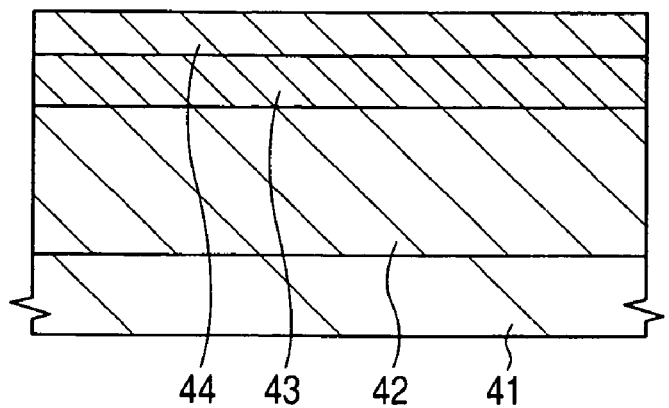
FIG. 30 is a cross-sectional view of an essential part of a substrate showing a manufacturing step of an n-channel MIS•FET which forms a channel using a nonselective SiGe:C of the embodiment 3 of the present invention.

First of all, as shown in FIG. 30, a substrate 41 which is made of a p-type silicon single crystallin is prepared. Subsequently, an epitaxial layer 42 is formed and, further, SiGe:C43 and Si44 to which B is added are formed sequentially from below. SiGe:C43 is formed by an epitaxial growth method due to decomposition of $Si_xH_{2x+2}$ ($SiH_4$, $Si_2H_6$ or the like) or gases containing Si such as DCS or the like, $GeH_4$, $B_2H_6$, $SiH_3CH_3$ by using $H_2$ as a carrier gas. Here, in the same manner as the above-mentioned embodiment 1, at the time of forming SiGe:C43, $SiH_3CH_3$ having a high concentration of 1 to 10% is diluted with $H_2$ and the diluted $SiH_3CH_3$ is supplied to a chamber of the epitaxial device. As a result, a concentration of an oxygen-based impurity which is contained in $SiH_3CH_3$ supplied to the chamber is diluted thus lowering the oxygen-based impurity contained in SiGe:C43 which is formed as a film.

Figure 31:
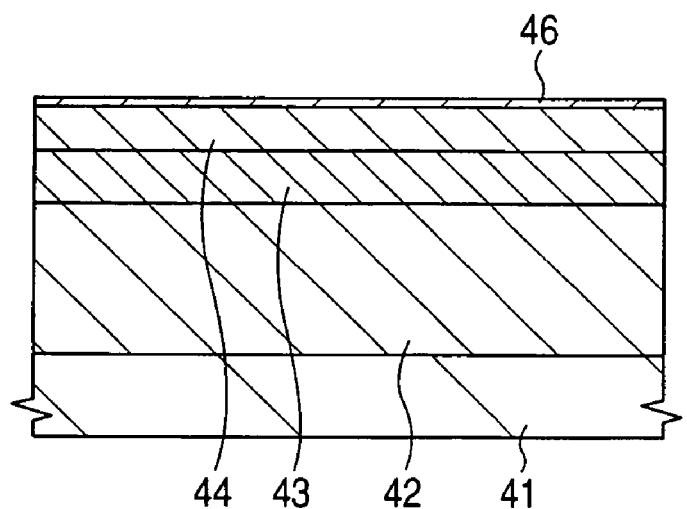
FIG. 31 is a cross-sectional view of an essential part of the same place in FIG. 30 showing a manufacturing step of an n-channel MIS•FET which follows the manufacturing step shown in FIG. 30.
Figure 32:
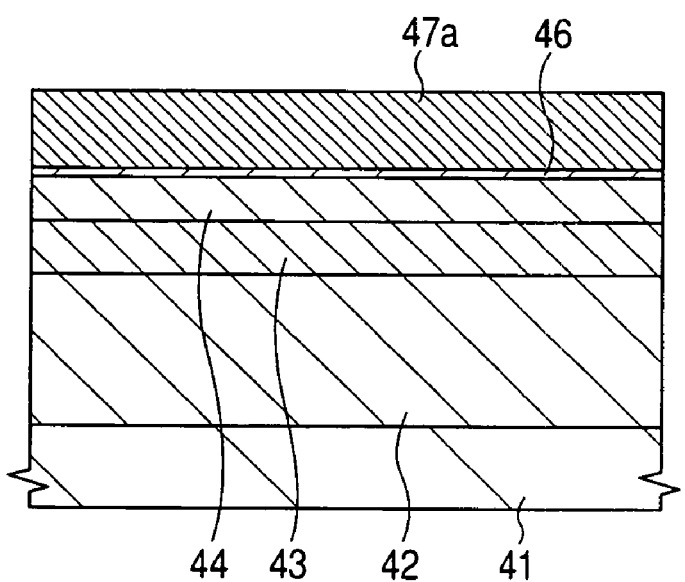
FIG. 32 is a cross-sectional view of an essential part of the same place in FIG. 30 showing a manufacturing step of an n-channel MIS•FET which follows the manufacturing step shown in FIG. 31.

Next, as shown in FIG. 31, a gate insulation film 46 which is made of a silicon oxide film is formed on Si44. The gate insulation film 46 is formed by thermally oxidizing a surface of Si44, for example. Subsequently, as shown in FIG. 32, a silicon poly-crystalline film 47a is stacked on the gate insulation film 46. The silicon poly-crystalline film 47a is, for example, formed by a CVD method and, an n-type impurity such as P, As or the like is added to the silicon poly-crystalline film 47a.

Figure 33:
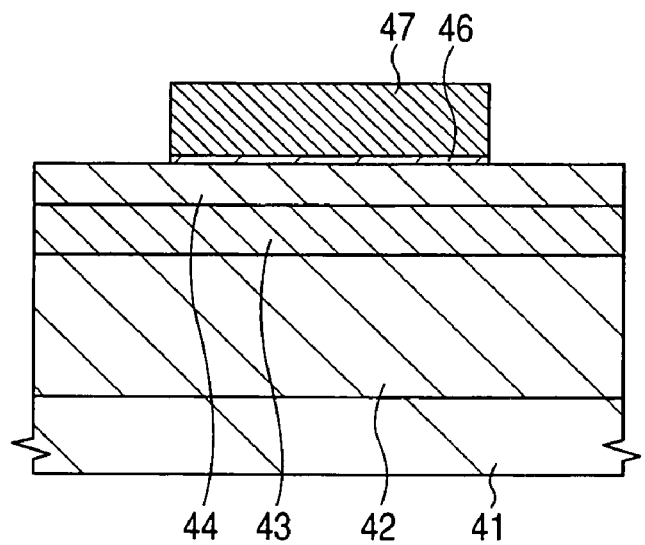
FIG. 33 is a cross-sectional view of an essential part of the same place in FIG. 30 showing a manufacturing step of an n-channel MIS•FET which follows the manufacturing step shown in FIG. 32.
Figure 34:
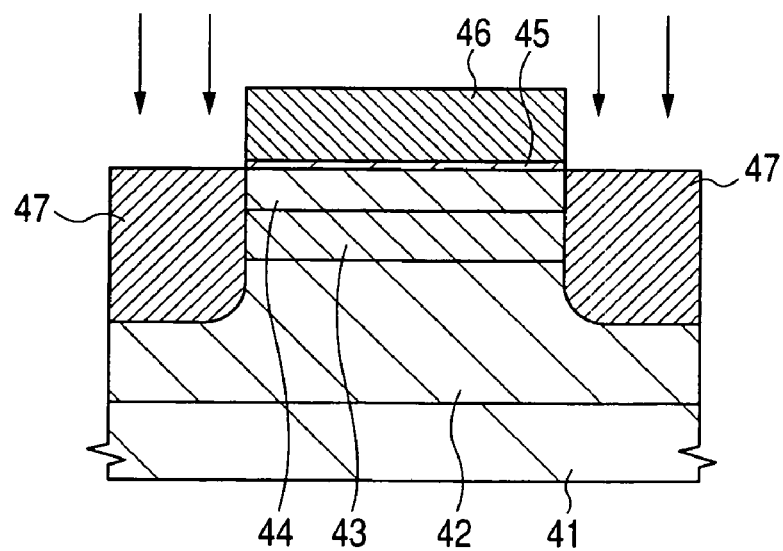
FIG. 34 is a cross-sectional view of an essential part of the same place in FIG. 30 showing a manufacturing step of an n-channel MIS•FET which follows the manufacturing step shown in FIG. 33.

Next, as shown in FIG. 33, silicon poly-crystalline film 47a and gate insulation film 46 are etched by using the patterned resist as a mask. The formed silicon poly-crystalline film 47a forms a gate electrode 47 of an n-channel MIS•FET. Subsequently, as shown in FIG. 34, by using the gate electrode 47 as a mask, the n-type impurity such as P, As or the like is injected by ion implantation into Si44, SiGe:C43 and the epitaxial layer 42 whereby a pair of n-type semiconductor regions 45 which constitutes a source and a drain is formed. Thereafter, the whole substrate 41 is covered with a passivation film, and a predetermined wiring or the like is formed thus almost completing the n-channel MIS•FET.

A manufacturing method of the n-channel MIS•FET which uses a selective SiGe:C of the embodiment 3 as the channel is explained in order of steps in conjunction with FIG. 35 to FIG. 40.

Figure 35:
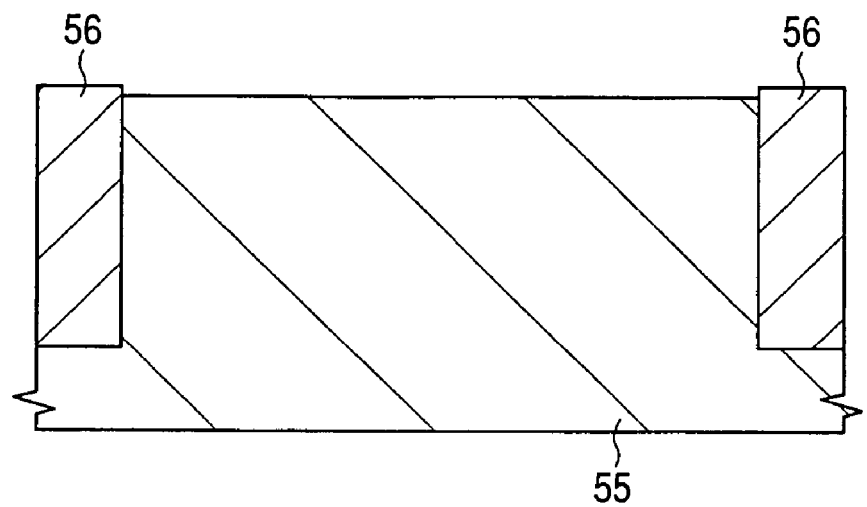
FIG. 35 is a cross-sectional view of an essential part of a substrate showing a manufacturing step of an n-channel MIS•FET which forms a channel using a selective SiGe:C according to the embodiment 3 of the present invention.

First of all, as shown in FIG. 35, a substrate 55 which is made of a p-type silicon single crystallin is prepared. Subsequently, by using the patterned resist as a mask, a groove is formed in the substrate 55. Next, a silicon oxide film is stacked on the substrate 55 and, thereafter, a surface of the silicon oxide film is leveled by a CMP (Chemical Mechanical Polishing) method, for example, thus leaving the silicon oxide film in the inside of the above-mentioned groove whereby an element isolation 56 is acquired.

Figure 36:
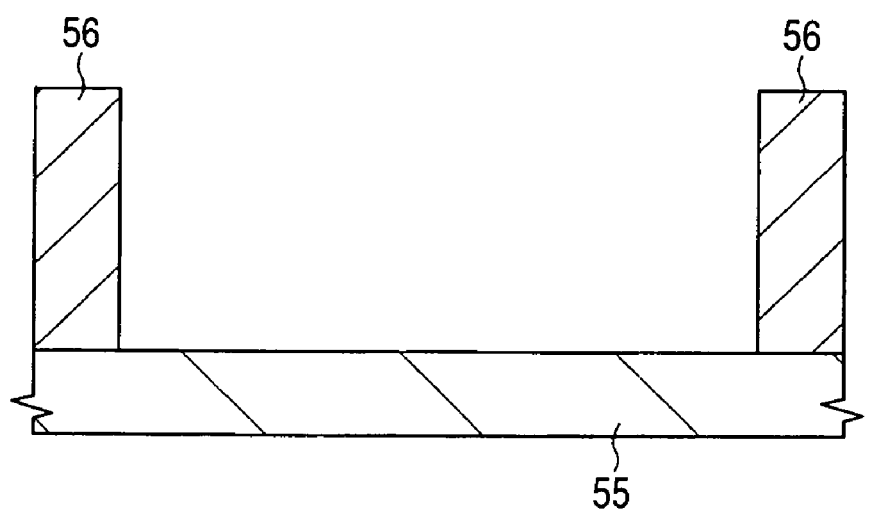
FIG. 36 is a cross-sectional view of an essential part of the same place in FIG. 35 showing a manufacturing step of an n-channel MIS•FET which follows the manufacturing step shown in FIG. 35.
Figure 37:
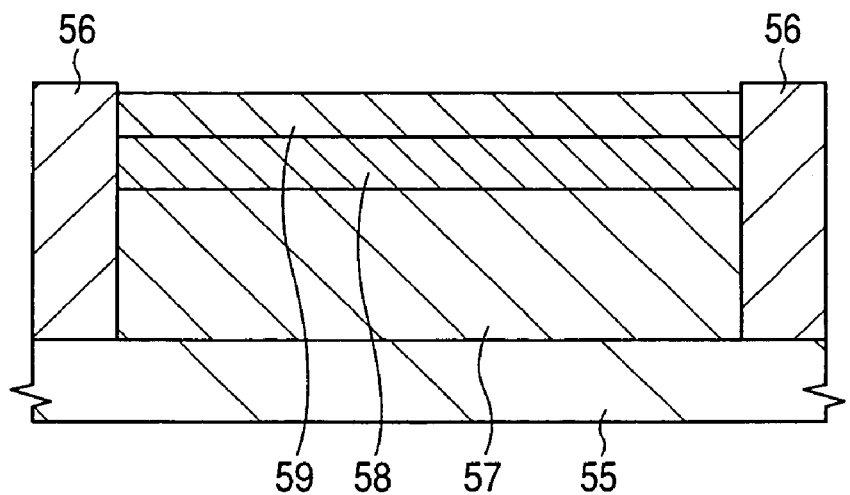
FIG. 37 is a cross-sectional view of an essential part of the same place in FIG. 35 showing a manufacturing step of an n-channel MIS•FET which follows the manufacturing step shown in FIG. 36.

Next, as shown in FIG. 36, the substrate 55 which is surrounded by the element isolation 56 is removed thus forming a recessed portion. Subsequently, as shown in FIG. 37, an epitaxial layer 57 is formed in the recessed portion and, further, SiGe:C58 and Si59 to which B is added are formed sequentially from below. SiGe:C58 is formed by an epitaxial growth method due to decomposition of DCS (or $Si_xH_{2x+2}$+ HCl, for example, $SiH_4$+HCl or the like), $GeH_4$, $B_2H_6$, $SiH_3CH_3$ by using $H_2$ as a carrier gas. Here, in the same manner as the embodiment 1, at the time of forming SiGe:

C58, $SiH_3CH_3$ having a high concentration of 1 to 10% is used and $SiH_3CH_3$ is diluted with $H_2$ and the diluted $SiH_3CH_3$ is supplied to a chamber of the epitaxial device. As a result, a concentration of an oxygen-based impurity which is contained in $SiH_3CH_3$ supplied to the chamber is diluted thus lowering the oxygen-based impurity contained in SiGe:C58 which is formed as a film.

Figure 38:
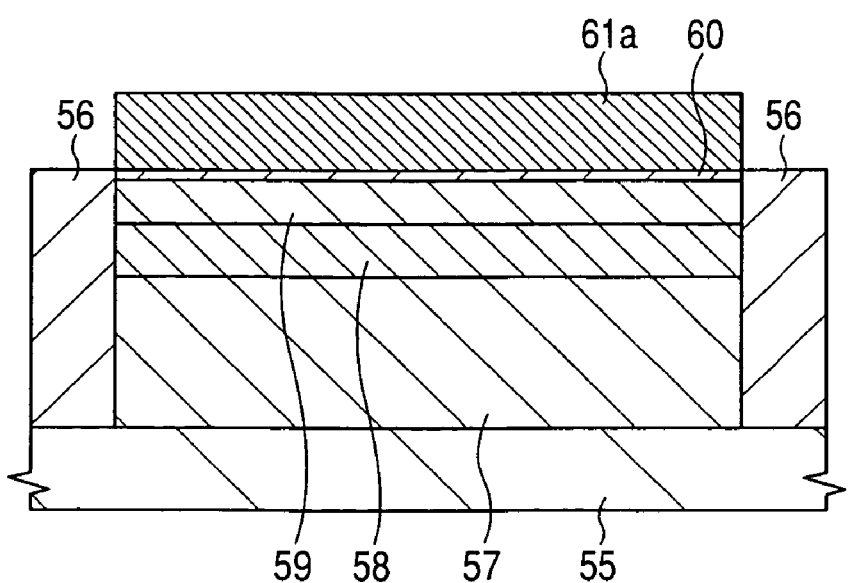
FIG. 38 is a cross-sectional view of an essential part of the same place in FIG. 35 showing a manufacturing step of an n-channel MIS•FET which follows the manufacturing step shown in FIG. 37.

Next, as shown in FIG. 38, a gate insulation film 60 which is made of a material having a relatively low dielectric constant such as $HfO_2$, for example, is formed on Si59. The gate insulation film 60 is formed by a CVD method, for example. Subsequently, a silicon poly-crystalline film 61a is stacked on the gate insulation film 60. The silicon poly-crystalline film 61a is, for example, formed by a CVD method and an n-type impurity such as P, As or the like is added to the silicon poly-crystalline film 61a.

Figure 39:
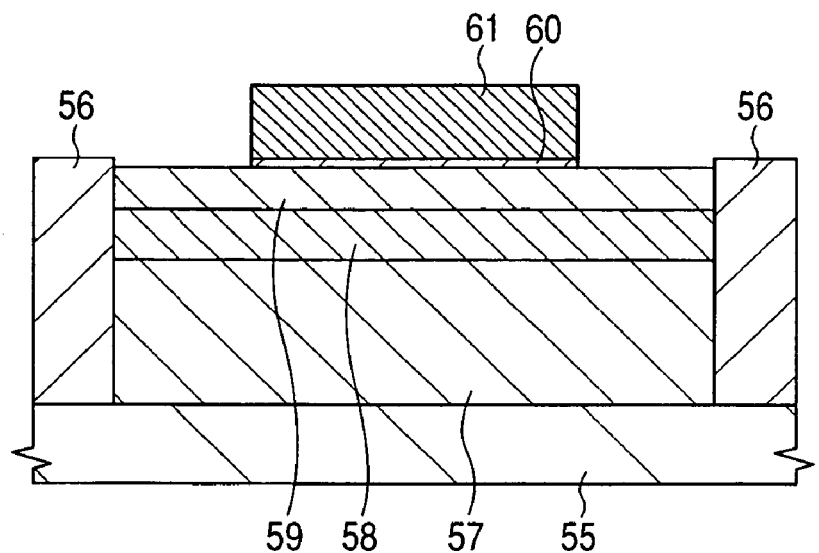
FIG. 39 is a cross-sectional view of an essential part of the same place in FIG. 35 showing a manufacturing step of an n-channel MIS•FET which follows the manufacturing step shown in FIG. 38.
Figure 40:
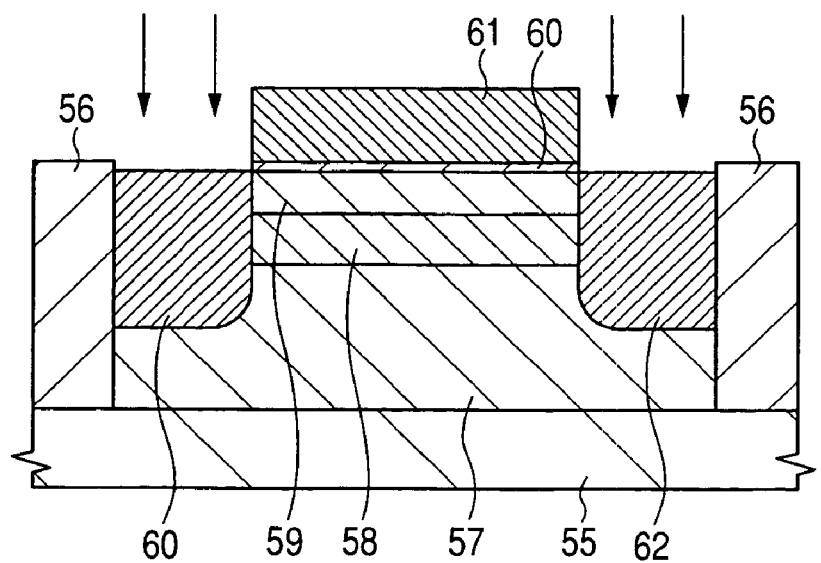
FIG. 40 is a cross-sectional view of an essential part of the same place in FIG. 35 showing a manufacturing step of an n-channel MIS•FET which follows the manufacturing step shown in FIG. 39.

Next, as shown in FIG. 39, the silicon poly-crystalline film 61a and the gate insulation film 60 are etched by using the patterned resist as a mask. The formed silicon poly-crystalline film 61a forms a gate electrode 61 of an n-channel MIS•FET. Subsequently, as shown in FIG. 40, by using the gate electrode 61 as a mask, an n-type impurity such as P, As or the like is injected by ion implantation into Si59, SiGe:C58 and the epitaxial layer 57 whereby a pair of n-type semiconductor region 62 which constitutes a source and a drain is formed. Thereafter, the whole substrate 55 is covered with a passivation film, and a predetermined wiring or the like is formed thus almost completing the n-channel MIS•FET.

In this manner, according to the embodiment 3, it is possible to constitute a channel of the MIS•FET by using SiGe:C in which oxygen-based impurity has a low concentration of which is formed by diluting $SiH_3CH_3$ having a high concentration of 1 to 10% with $H_2$ and, thereafter, by supplying diluted SiGe:C to the chamber of the epitaxial device. Accordingly, it is possible to reduce an occurrence of a defect attributed to an oxygen atom in the channel and to suppress a leaked current attributed to the defect and hence, it is possible to enhance the reliability of the MIS•FET.

Although the invention made by the inventors of the present invention have been specifically explained in conjunction with the embodiments heretofore, it is needless to say that the present invention is not limited to the above-mentioned embodiments and various modifications are conceivable without departing from the gist of the present invention.

For example, in the above-mentioned embodiments, the explanation is made with respect to the case in which SiGe:C is used as the material of the base of the HBT or the channel of the MIS•FET. However, the present invention is applicable to any semiconductor device which includes SiGe:C.

INDUSTRIAL APPLICABILITY

The present invention is applicable to a semiconductor device which includes SiGe:C formed by an epitaxial growth technique and, specifically, to the HBT which uses SiGe:C as a base or the MIS•FET which uses SiGe:C as a substrate.

The invention claimed is:

1. A manufacturing method of a semiconductor device comprising the steps of:
   (a) preparing a first raw material gas which contains a silane-based compound gas containing carbon atoms with the first concentration of 0.3% or more in a first hydrogen gas;
   (b) producing a first diluted raw material gas containing the silane-based compound gas with the second concentration lower than the first concentration by diluting the first raw material gas with a second hydrogen gas;
   (c) supplying, after the step (b), a first portion of the first diluted raw material gas into the inside of a reaction chamber in which a wafer to be processed is accommodated, through a mass flow controller; and
   (d) forming a SiGe:C epitaxial layer or a SiGe:C-based epitaxial layer on a first main surface of the wafer to be processed using a gas containing germanium atoms and the first portion of the supplied first diluted raw material gas supplied through the mass flow controller,
   wherein a remaining second portion of the first diluted raw material gas is not supplied to the inside of the reaction chamber through the mass flow controller, and is discharged without flowing through the mass flow controller.

2. A manufacturing method of a semiconductor device according to claim 1, wherein the first hydrogen gas and the second hydrogen gas have the substantially same concentration composition.

3. A manufacturing method of a semiconductor device according to claim 2, wherein the purity of the second hydrogen gas is 99.99% or more.

4. A manufacturing method of a semiconductor device according to claim 1, wherein the reaction chamber is an epitaxial layer forming reaction chamber of a single wafer epitaxial device.

5. A manufacturing method of a semiconductor device according to claim 1, wherein the reaction chamber is an epitaxial layer forming reaction chamber of a batch-type epitaxial device.

6. A manufacturing method of a semiconductor device according to claim 1, wherein the epitaxial layer constitutes a portion of a base region of a HBT.

7. A manufacturing method of a semiconductor device according to claim 1, wherein the epitaxial layer is a channel region of a strain SiGe-based MISFET.

8. A manufacturing method of a semiconductor device according to claim 1, wherein the degree of dilution of the first diluted raw material gas is set to a value which falls within a range from 2 to 100.

9. A manufacturing method of a semiconductor device according to claim 1, wherein the degree of dilution of the first diluted raw material gas is set to a value which falls within a range from 3 to 50.

10. A manufacturing method of a semiconductor device according to claim 1, wherein the degree of dilution of the first diluted raw material gas is set to a value which falls within a range from 4 to 20.

11. A manufacturing method of a semiconductor device according to claim 1, wherein the degree of dilution of the first diluted raw material gas is set to a value which falls within a range from 6 to 15.

12. A manufacturing method of a semiconductor device according to claim 1, wherein the degree of introduction of the first diluted raw material gas is set to a value which falls within a range from 2 to 100.

13. A manufacturing method of a semiconductor device according to claim 1, wherein the degree of introduction of the first diluted raw material gas is set to a value which falls within a range from 3 to 50.

14. A manufacturing method of a semiconductor device according to claim 1, wherein the degree of introduction of the first diluted raw material gas is set to a value which falls within a range from 4 to 20.

15. A manufacturing method of a semiconductor device according to claim 1, wherein the degree of introduction of the first diluted raw material gas is set to a value which falls within a range from 6 to 15.

16. A manufacturing method of a semiconductor device according to claim 1, wherein the first concentration is equal to or more than 0.6%.

17. A manufacturing method of a semiconductor device according to claim 1, wherein the first concentration is equal to or more than 1%.

18. A manufacturing method of a semiconductor device according to claim 1, wherein the first concentration is equal to or more than 2%.

19. A manufacturing method of a semiconductor device according to claim 1, wherein the first concentration is equal to or more than 5%.

20. A manufacturing method of a semiconductor device according to claim 1, wherein said remaining second portion is discharged from a vent line.

* * * * *